(12) United States Patent
Chiu et al.

(10) Patent No.: US 12,087,767 B2
(45) Date of Patent: Sep. 10, 2024

(54) METHOD OF TUNING THRESHOLD VOLTAGES OF TRANSISTORS

(71) Applicant: Taiwan Semiconductor Manufacturing Co., Ltd., Hsinchu (TW)

(72) Inventors: Kuan-Chang Chiu, Hsinchu (TW); Chia-Ching Lee, New Taipei (TW); Chien-Hao Chen, Chuangwei Township (TW); Hung-Chin Chung, Pingzhen (TW); Hsien-Ming Lee, Changhua (TW); Chi On Chui, Hsinchu (TW); Hsuan-Yu Tung, Keelung (TW); Chung-Chiang Wu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/068,647

(22) Filed: Dec. 20, 2022

(65) Prior Publication Data

US 2023/0122022 A1    Apr. 20, 2023

Related U.S. Application Data

(63) Continuation of application No. 17/089,291, filed on Nov. 4, 2020, now Pat. No. 11,538,805.
(Continued)

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823431* (2013.01); *H01L 29/41791* (2013.01);
(Continued)

(58) Field of Classification Search
CPC ........... H01L 27/0886; H01L 29/41791; H01L 29/42372; H01L 29/6681; H01L 29/785; H01L 21/823431
See application file for complete search history.

(56) References Cited

U.S. PATENT DOCUMENTS 6,376,888 B1    4/2002    Tsunashima et al.
9,553,090 B2    1/2017    Chang et al.
(Continued)

FOREIGN PATENT DOCUMENTS

JP    2000315789 A    11/2000
KR    20160140321 A    12/2016
(Continued)

*Primary Examiner* — Christine A Enad
(74) *Attorney, Agent, or Firm* — Slater Matsil, LLP

(57) ABSTRACT

A structure includes a semiconductor substrate including a first semiconductor region and a second semiconductor region, a first transistor in the first semiconductor region, and a second transistor in the second semiconductor region. The first transistor includes a first gate dielectric over the first semiconductor region, a first work function layer over and contacting the first gate dielectric, and a first conductive region over the first work function layer. The second transistor includes a second gate dielectric over the second semiconductor region, a second work function layer over and contacting the second gate dielectric, wherein the first work function layer and the second work function layer have different work functions, and a second conductive region over the second work function layer.

20 Claims, 24 Drawing Sheets

US 12,087,767 B2
Page 2

Related U.S. Application Data

(60) Provisional application No. 63/045,290, filed on Jun. 29, 2020.

(51) Int. Cl.
*H01L 29/417* (2006.01)
*H01L 29/423* (2006.01)
*H01L 29/66* (2006.01)
*H01L 29/78* (2006.01)

(52) U.S. Cl.
CPC .... *H01L 29/42372* (2013.01); *H01L 29/6681* (2013.01); *H01L 29/785* (2013.01)

(56) References Cited

U.S. PATENT DOCUMENTS

| | | | |
|---|---|---|---|
| 9,653,364 B1 | 5/2017 | Chang et al. | |
| 10,283,417 B1 | 5/2019 | Huang et al. | |
| 10,529,817 B2 | 1/2020 | Song et al. | |
| 10,643,904 B2 | 5/2020 | Xie et al. | |
| 11,164,869 B2 | 11/2021 | Ha et al. | |
| 2017/0140992 A1 | 5/2017 | Chang et al. | |
| 2018/0122709 A1 | 5/2018 | Xie et al. | |
| 2019/0189767 A1 | 6/2019 | Song et al. | |
| 2019/0198498 A1* | 6/2019 | Park | H01L 29/42364 |
| 2020/0243521 A1* | 7/2020 | Ha | H01L 21/823821 |

FOREIGN PATENT DOCUMENTS

| | | |
|---|---|---|
| KR | 20180048403 A | 5/2018 |
| KR | 20190000965 A | 1/2019 |
| KR | 20190003342 A | 1/2019 |
| KR | 20190072068 A | 6/2019 |
| KR | 20190074013 A | 6/2019 |
| KR | 102058222 B1 | 12/2019 |
| TW | 2017255730 A | 7/2017 |
| TW | I624875 B | 5/2018 |

* cited by examiner

… … …

METHOD OF TUNING THRESHOLD VOLTAGES OF TRANSISTORS

PRIORITY CLAIM AND CROSS-REFERENCE

This application is a continuation of U.S. patent application Ser. No. 17/089,291, entitled "Method of tuning threshold voltages of transistors," filed on Nov. 4, 2020, which claims the benefit of the U.S. Provisional Application No. 63/045,290, filed on Jun. 29, 2020, and entitled "Innovative Metal-gate Stacks for Advanced Transistors' Multi-Vts Tuning," which applications are hereby incorporated herein by reference.

BACKGROUND

Transistors are basic building elements in integrated circuits. The formation of the transistors may include forming replacement gates, which include high-k gate dielectrics and metal gate electrodes over the high-k gate dielectrics. The formation of a replacement gate typically involves depositing a high-k gate dielectric and metal layers over the high-k gate dielectric, and then performing Chemical Mechanical Polish (CMP) to remove excess portions of the high-k gate dielectric and the metal layers. The remaining portions of the metal layers form the metal gates.

In conventional formation methods of the MOS devices, the threshold voltages of the transistors may be adjusted by stacking a plurality of work function layers. For example, for p-type transistors, a plurality of titanium nitride layers may be stacked to reduce the threshold voltages of the p-type transistors and to generate multiple threshold levels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
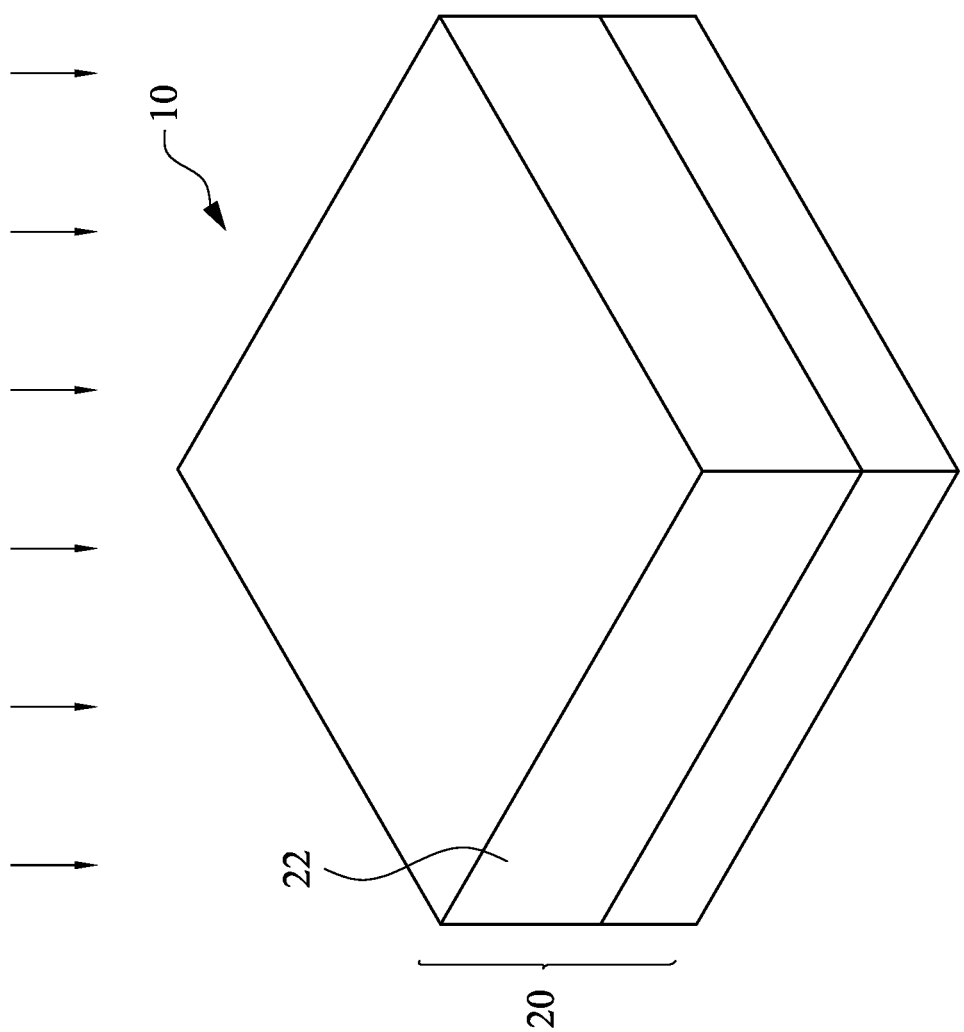
FIGS. 1-6, 7A, 7B, 8, 9A, 9B, 22, and 23 illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors having different threshold voltages and the methods of forming the same are provided in accordance with various embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to discuss the concept of the present disclosure. Other types of transistors such as planar transistors and Gate-All-Around (GAA) transistors may also adopt the concept of the present disclosure. In accordance with some embodiments of the present disclosure, in the formation of work function layers, a plurality of work function layers with different work functions may be deposited. An upper work function layer may be etched using the respective lower work function layer as an etch stop layer, so that the total thickness of the work function layers in a FinFET is limited, while different levels of threshold voltages may be achieved.

FIGS. 1-6, 7A, 7B, 8, 9A, 9B, 22, and 23 illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 200 shown in FIG. 24.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 24. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
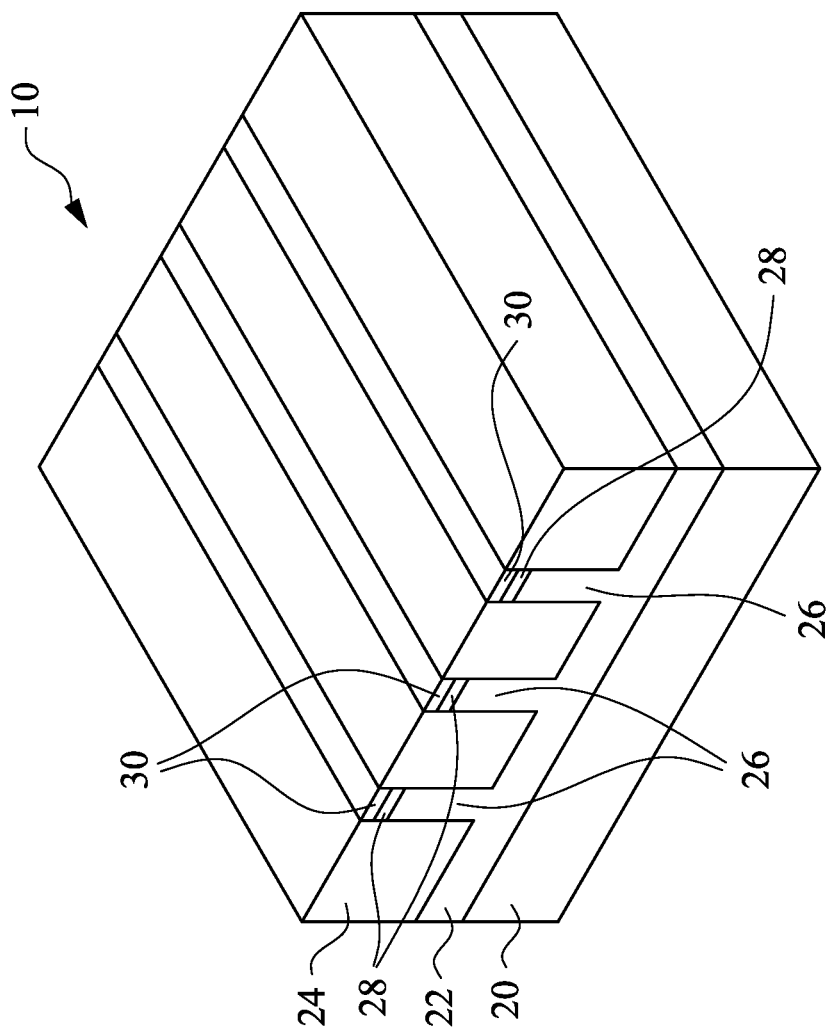

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow 200 shown in FIG. 24. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitriding of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through a thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard masks 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
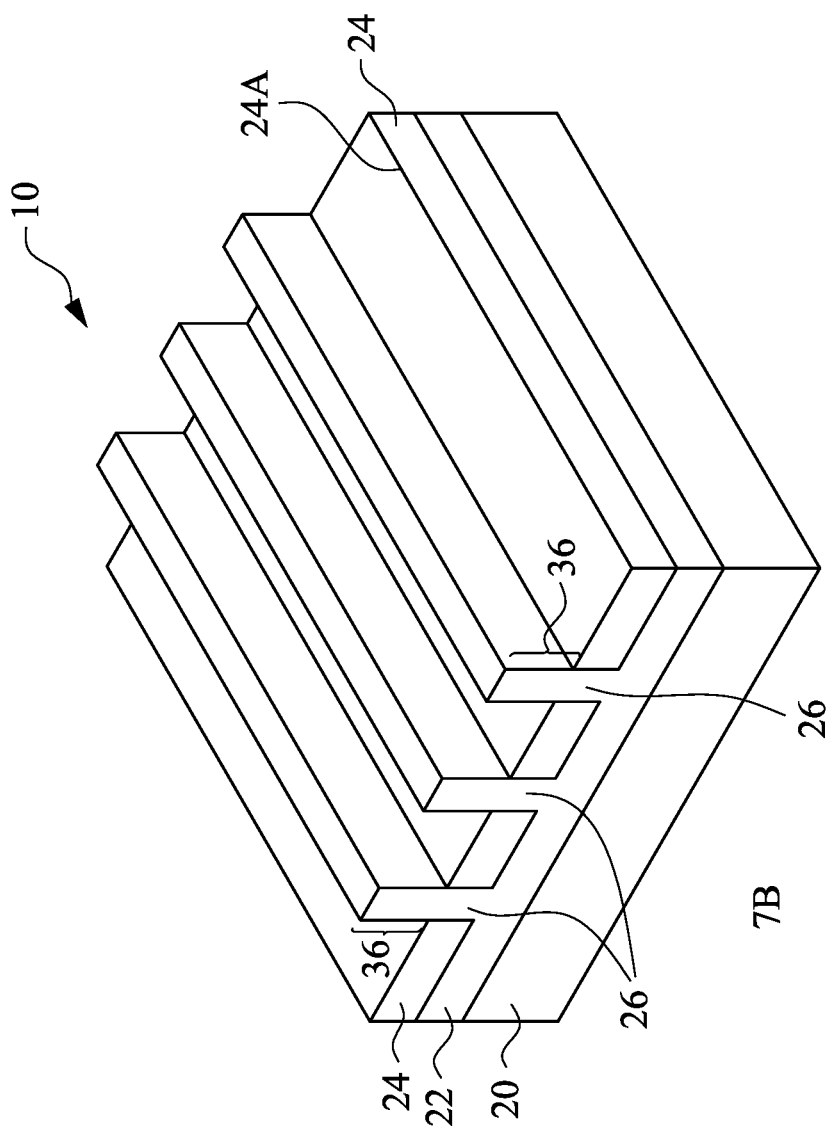

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 206 in the process flow 200 shown in FIG. 24. The etching may be performed using a dry etching process, wherein $NF_3$ and $NH_3$, for example, are used as the etching gases. During the etching process, plasma may be generated. Argon may also be included. In accordance with alternative embodiments of the present disclosure, the recessing of STI regions 24 is performed using a wet etching process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
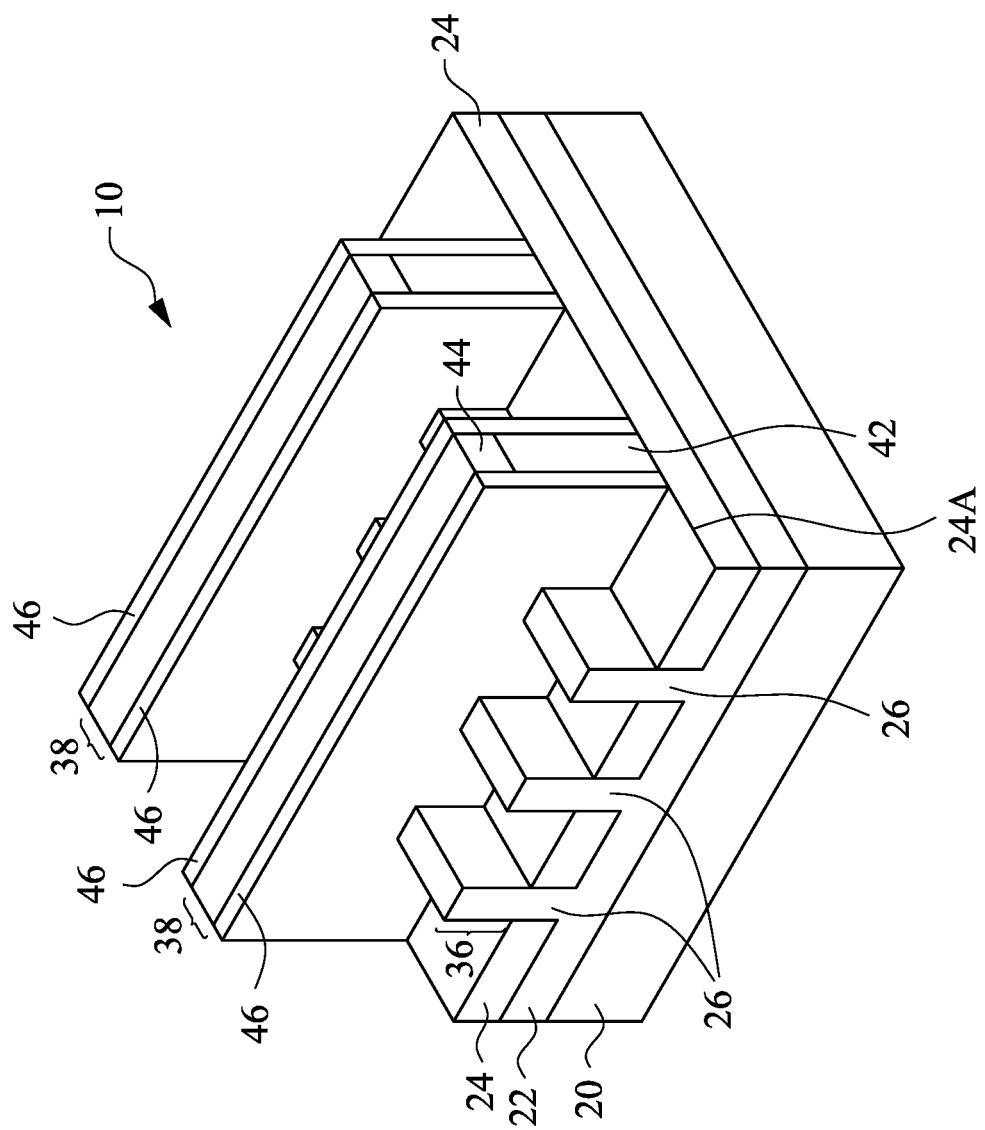

Referring to FIG. 4, dummy gate stacks 38 are formed to extend on the top surfaces and the sidewalls of (protruding) fins 36. The respective process is illustrated as process 208 in the process flow 200 shown in FIG. 24. Dummy gate stacks 38 may include dummy gate dielectrics 40 (FIG. 7B) and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 208 in the process flow 200 shown in FIG. 24. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
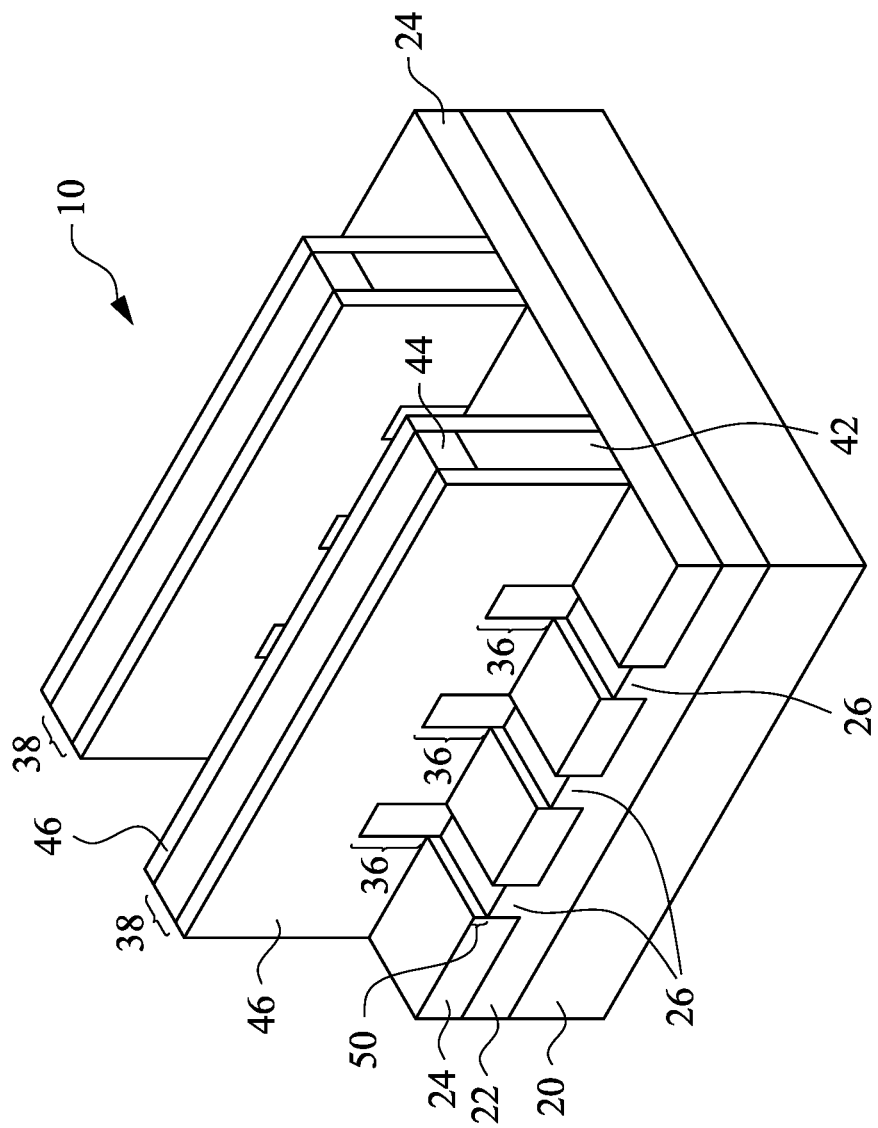

An etching process is then performed to etch the portions of protruding fins 36 that are not covered by dummy gate stacks 38 and gate spacers 46, resulting in the structure shown in FIG. 5. The respective process is illustrated as process 210 in the process flow 200 shown in FIG. 24. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 6:
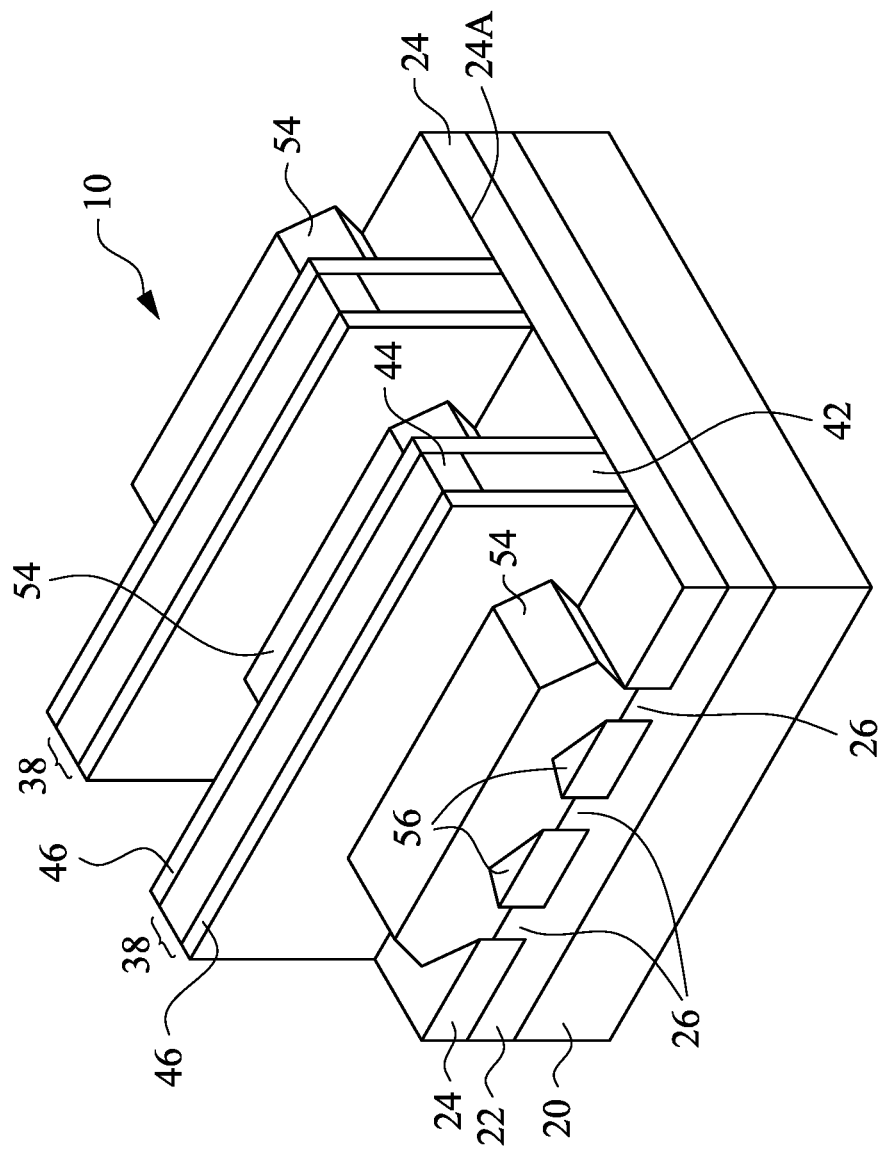

Next, epitaxy regions (source/drain regions) 54 are formed by selectively growing (through epitaxy) a semiconductor material in recesses 50, resulting in the structure in FIG. 6. The respective process is illustrated as process 212 in the process flow 200 shown in FIG. 24. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB) or silicon boron (SiB) may be grown. Conversely, when the resulting FinFET is an n-type FinFET, silicon phosphorous (SiP) or silicon carbon phosphorous (SiCP) may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

After the epitaxy step, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
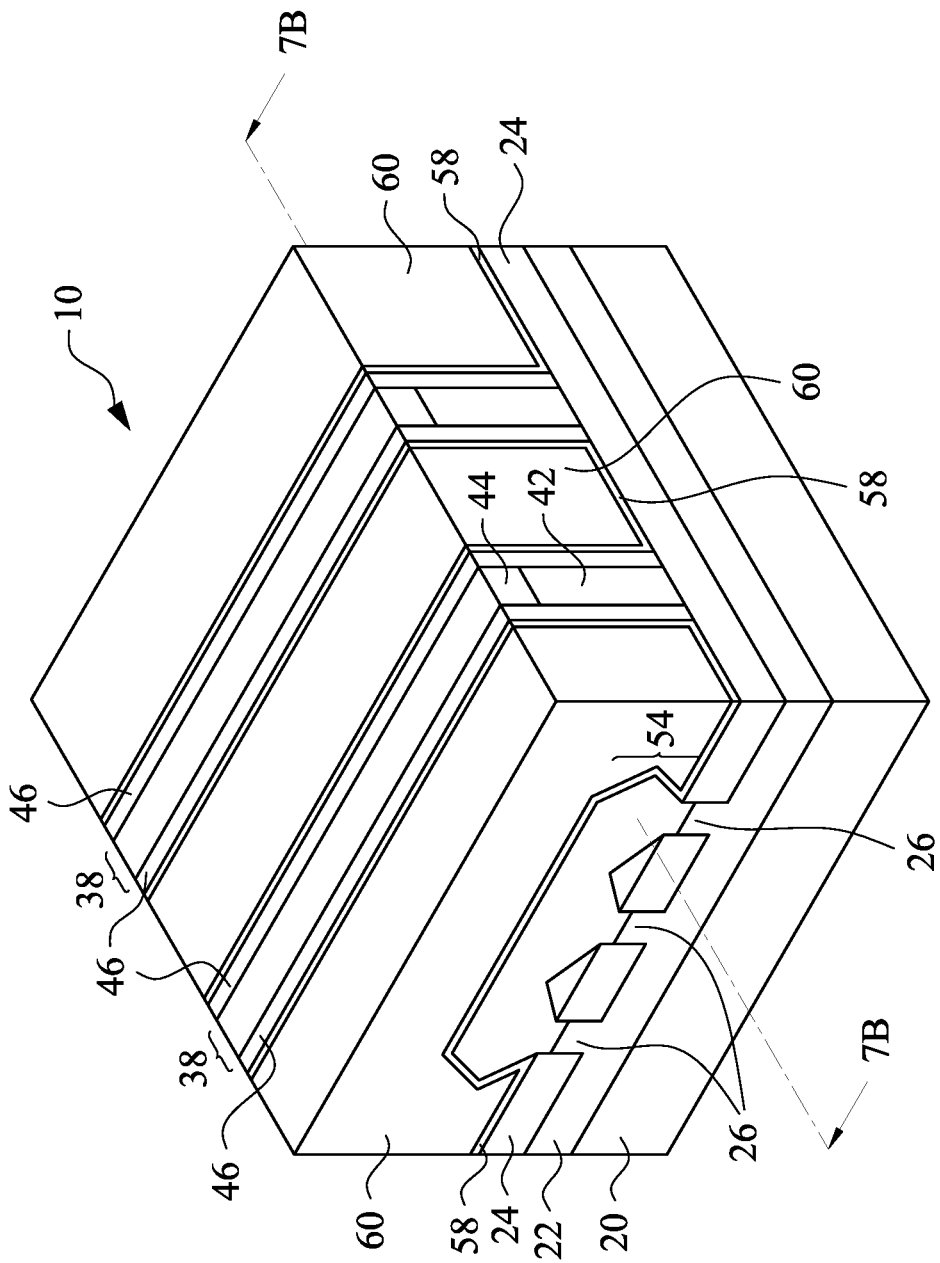
Figure 7B:
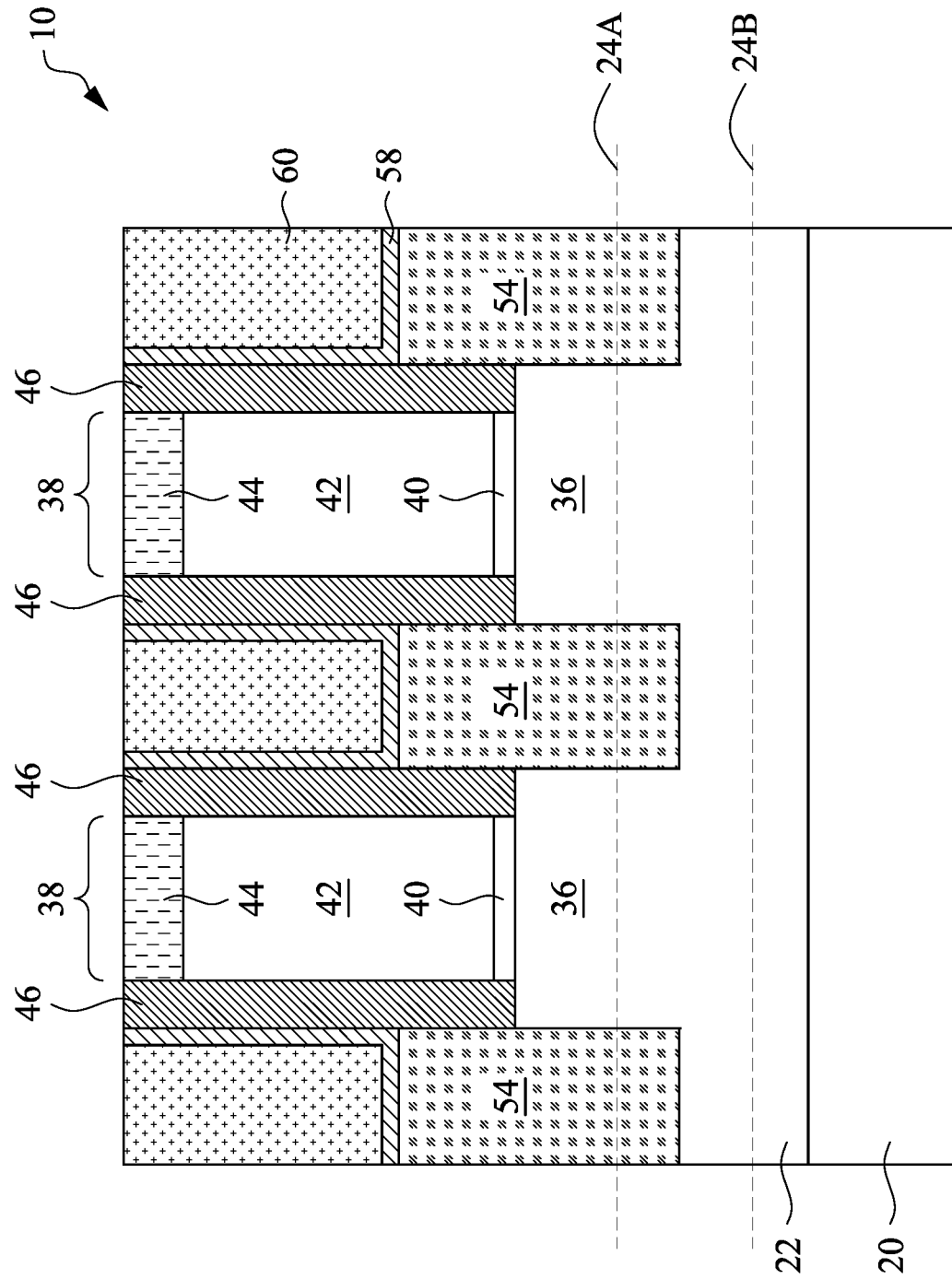

FIG. 7A illustrates a perspective view of the structure after the formation of Contact Etch Stop Layer (CESL) 58 and Inter-Layer Dielectric (ILD) 60. The respective process is illustrated as process 214 in the process flow 200 shown in FIG. 24. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), a low-k dielectric material, or the like. A planarization process such as a CMP process or a mechanical grinding process may be performed to level the top surfaces of ILD 60, dummy gate stacks 38, and gate spacers 46 with each other. FIG. 7B illustrates the reference cross-section 7B-7B in FIG. 7A. The top surfaces 24A and bottom surfaces 24B of STI regions 24 are illustrate to show where the STI regions 24 are, and where the bottoms of protruding fins 36 are.

Figure 8:
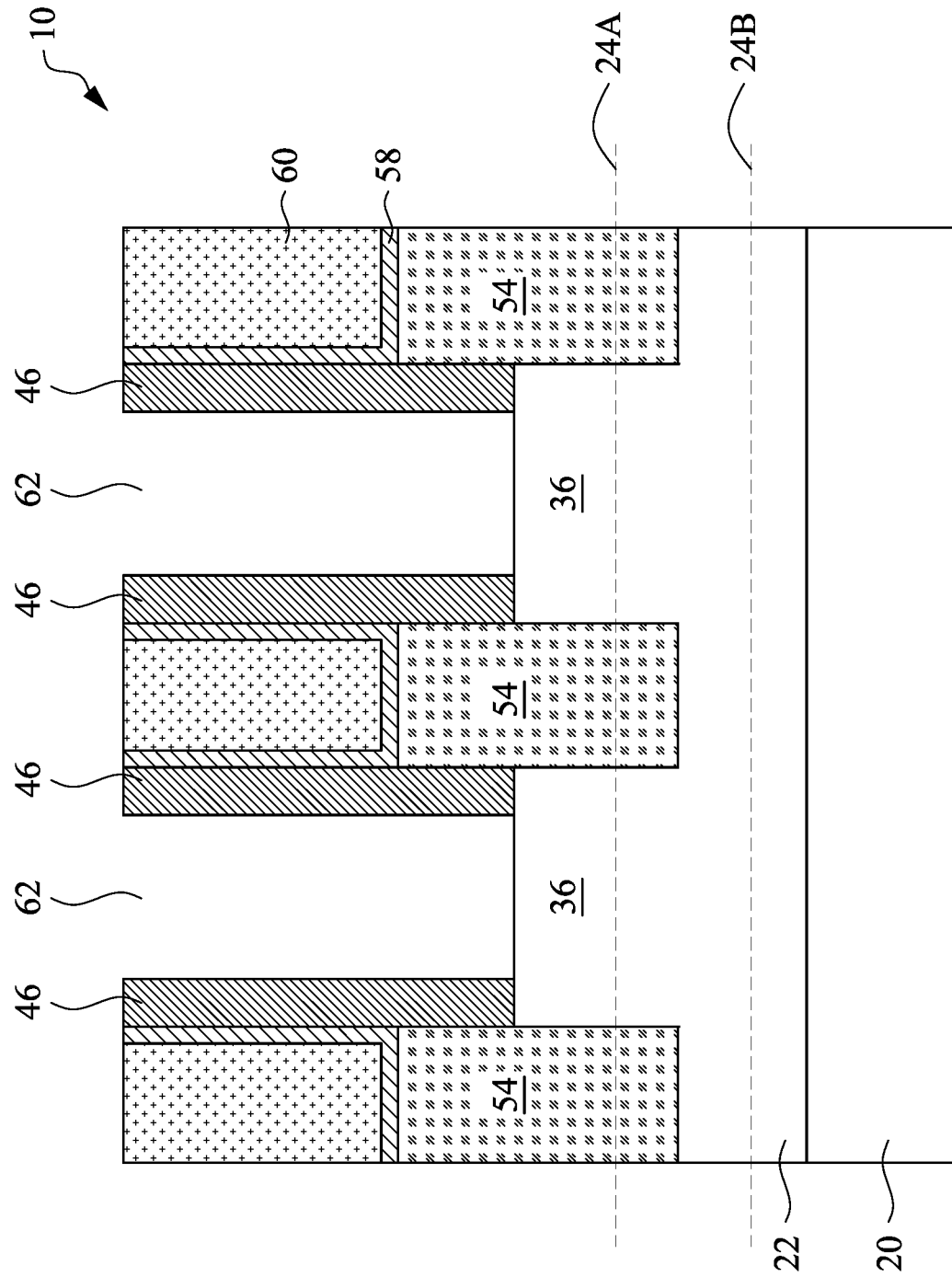
Figure 9A:
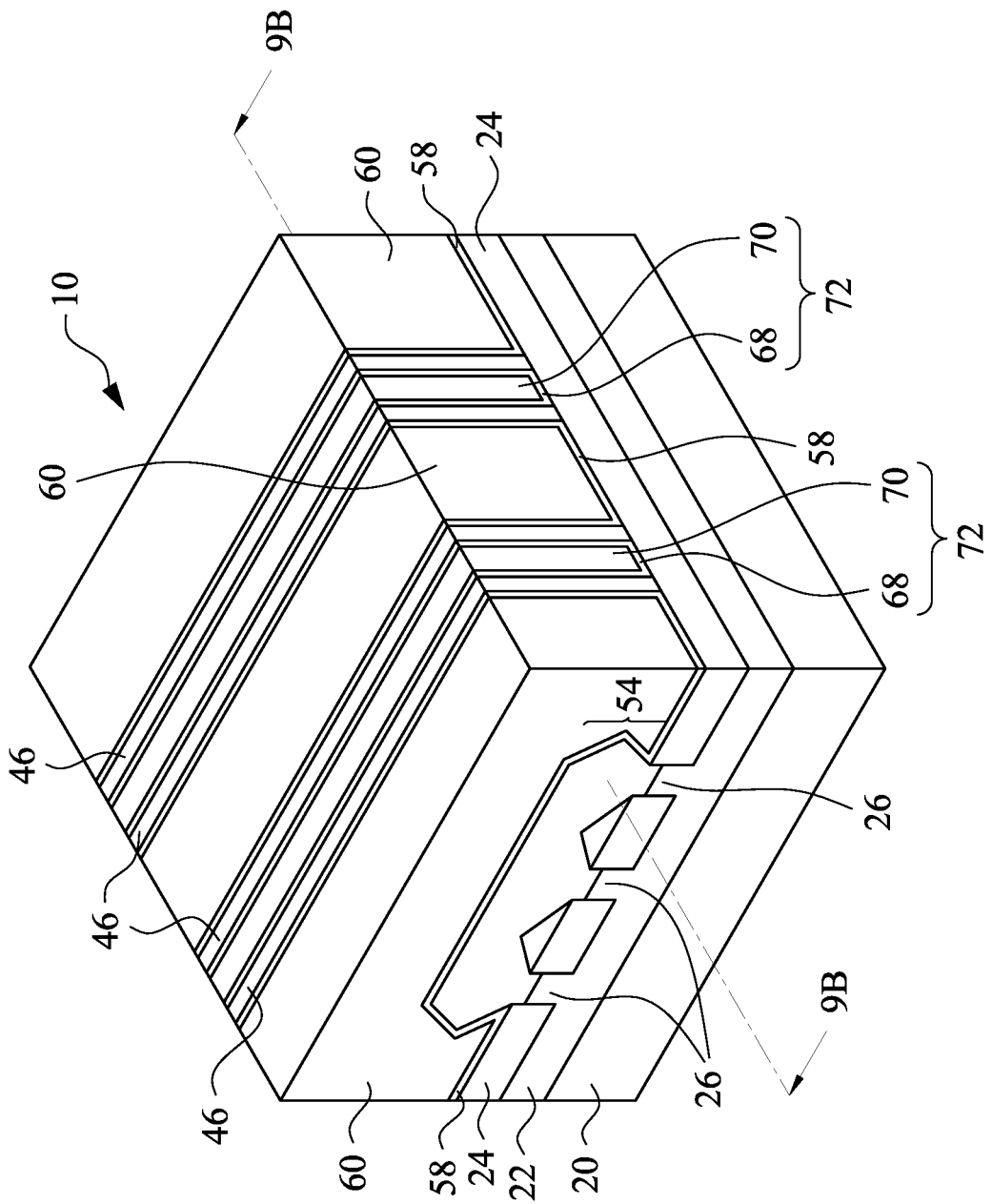
Figure 9B:
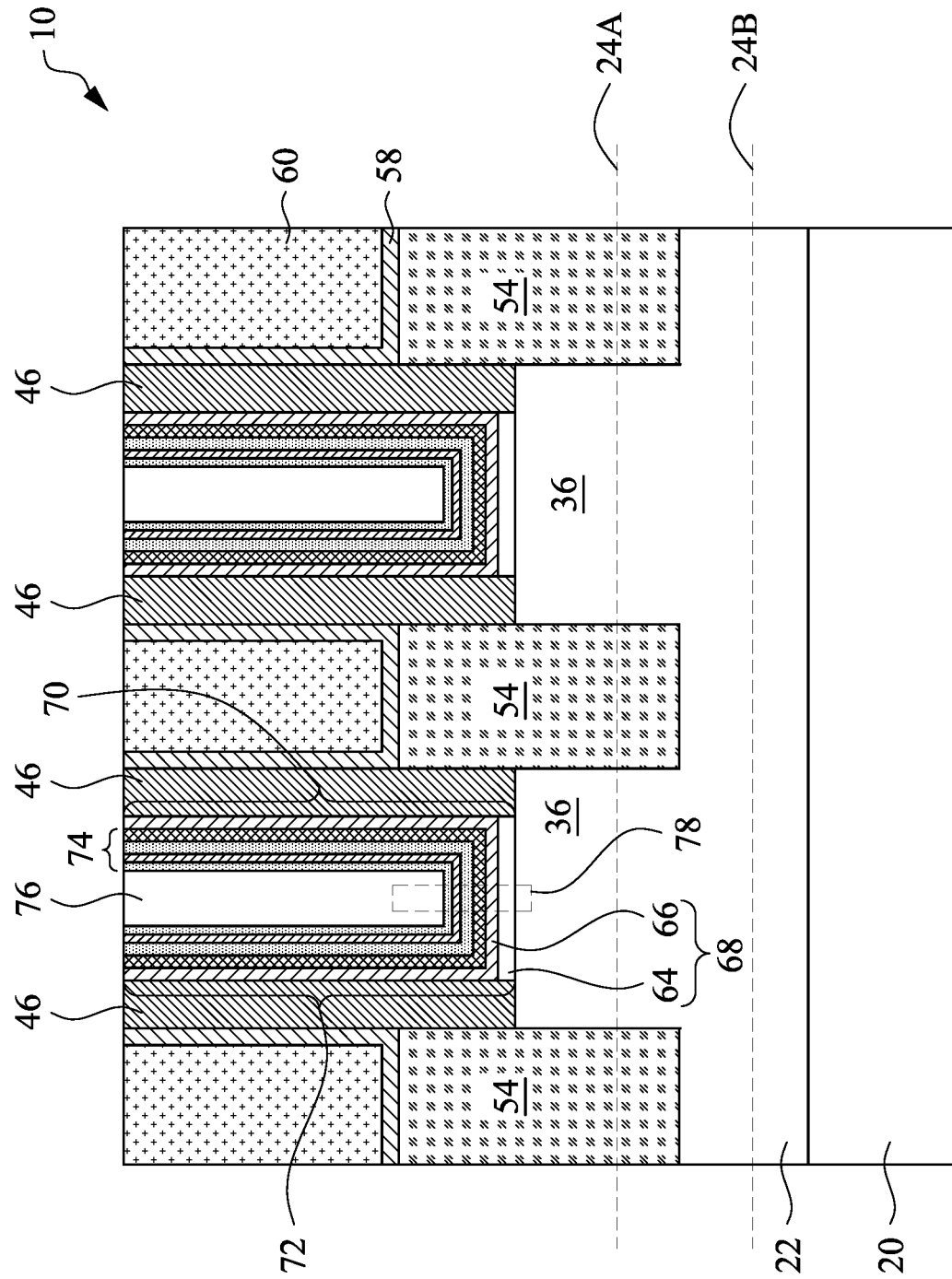

Next, the dummy gate stacks 38 including hard mask layers 44, dummy gate electrodes 42 and dummy gate dielectrics 40 are etched, forming trenches 62 between gate spacers 46, as shown in FIG. 8. The respective process is illustrated as process 216 in the process flow 200 shown in FIG. 24. The top surfaces and the sidewalls of protruding fins 36 are exposed to trenches 62. Next, as shown in FIGS. 9A and 9B, replacement gate stacks 72 are formed in trenches 62 (FIG. 8). The respective process is illustrated as process 218 in the process flow 200 shown in FIG. 24. FIG. 9B illustrates the reference cross-section 9B-9B in FIG. 9A. Replacement gate stacks 72 include gate dielectrics 68 and the corresponding gate electrodes 70.

In accordance with some embodiments of the present disclosure, a gate dielectric 68 includes Interfacial Layer (IL) 64 as its lower part, as shown in FIG. 9B. IL 64 is formed on the exposed top surfaces and sidewall surfaces of protruding fins 36. IL 64 may include an oxide layer such as a silicon oxide layer, which is formed through the thermal oxidation or chemical oxidation of the surface layers of protruding fins 36, or through a deposition process. Gate dielectric 68 may also include high-k dielectric layer 66 formed over IL 64. High-k dielectric layer 66 includes a high-k dielectric material such as hafnium oxide, lanthanum oxide, aluminum oxide, zirconium oxide, or the like, or composite layers thereof. The dielectric constant (k-value) of the high-k dielectric material is higher than 3.9, and may be higher than about 7.0. High-k dielectric layer 66 is formed as a conformal layer, and extends on the top surfaces and sidewalls of protruding fins 36 and the top surface and the sidewalls of gate spacers 46. In accordance with some embodiments of the present disclosure, high-k dielectric layer 66 is formed using ALD, CVD, PECVD, Molecular-Beam Deposition (MBD), or the like.

Further referring to FIG. 9B, gate electrode 70 is formed on gate dielectric 68. Gate electrode 70 may include a plurality of stacked layers 74, which may be formed as conformal layers, and filling-metal regions 76 filling the rest of the trenches unfilled by the plurality of stacked layers 74. Stacked layers 74 may include a barrier layer, one or a plurality of work function layers over the barrier layer, and possibly a glue layer over the work function layer(s). In accordance with some embodiments, high-k dielectric layer 66 and stacked layers 74 are deposited layer-by-layer as conformal layers, followed by the deposition of filling-metal regions 76 to fully fill trenches 62 (FIG. 8). The conformal layers may include first portions in trenches 62 and second portions overlapping ILD 60. A planarization process such as a CMP process or a mechanical grinding process is performed to remove excess portions of the deposited materials. Resulting in the structure shown in FIGS. 9A and 9B. The detailed structure and the formation method of the stacked layers 74 are discussed referring to FIGS. 10 through 20.

Figure 24:
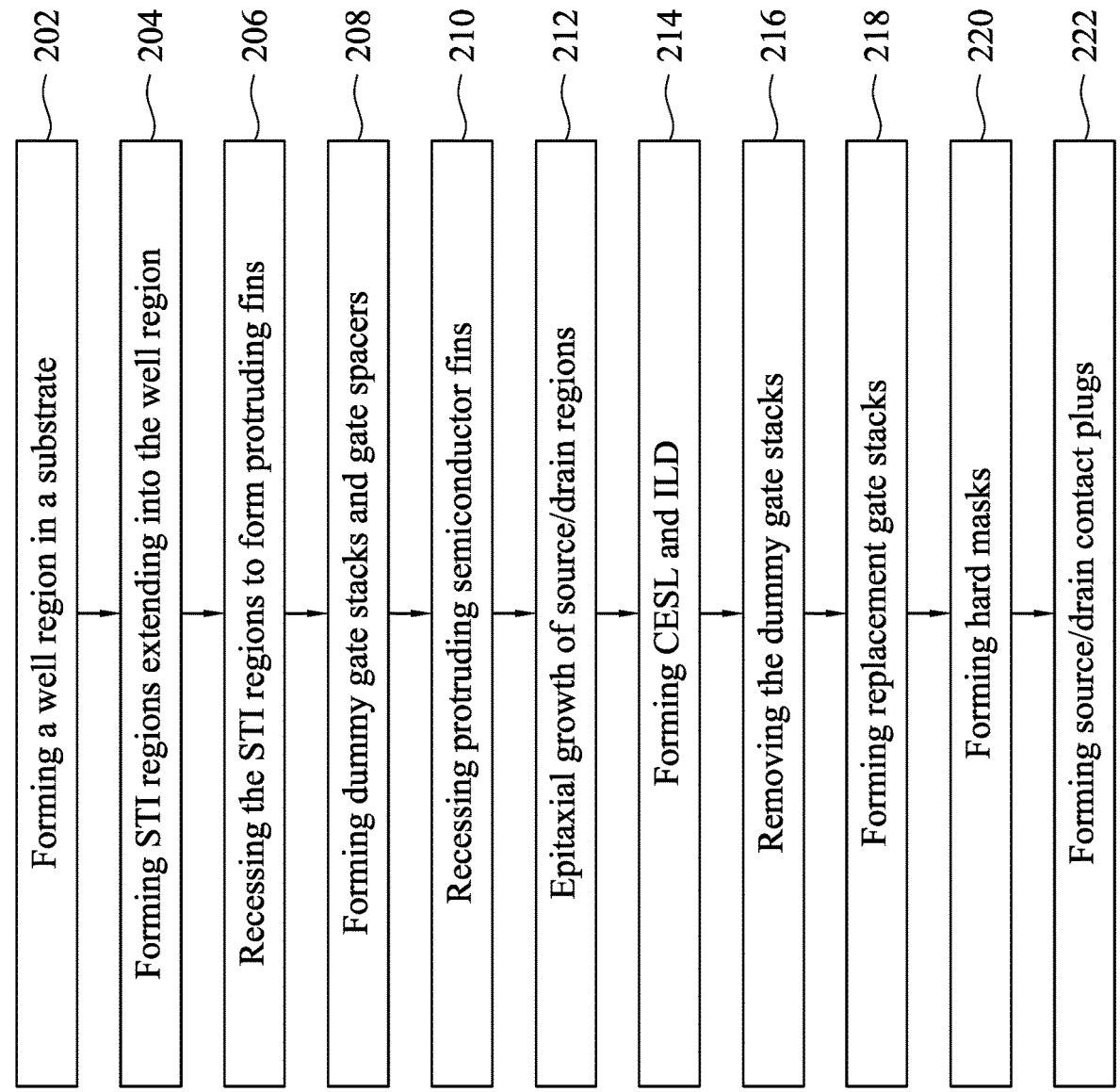
FIG. 24 illustrates a process flow for forming a FinFET in accordance with some embodiments.
Figure 25:
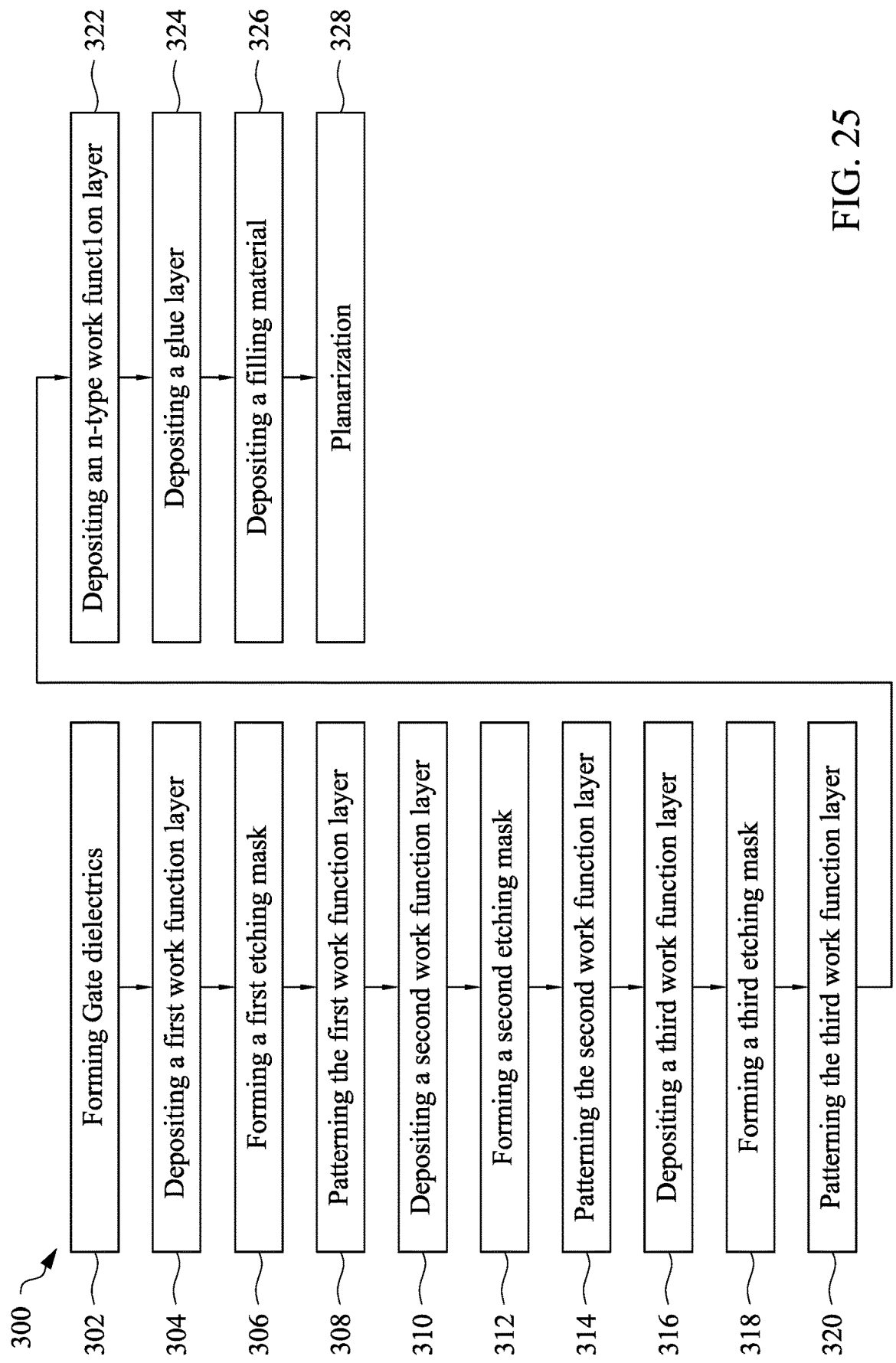
FIG. 25 illustrates a process flow for forming gate stacks of FinFETs in accordance with some embodiments.

FIG. 9B schematically illustrates region 78, in which a portion of fin 36, a portion of gate dielectric 68, a portion of stacked layers 74, and a portion of filling-metal region 76 are included. FIGS. 10 through 20 illustrate the formation of the features in region 78 in accordance with some embodiments. The respective process is illustrated as process flow 300 as shown in FIG. 25. The process 218 as shown in FIG. 24 is achieved through process flow 300.

FIGS. 10 through 20 illustrate the formation of the gate stacks of four FinFETs in device regions 100A, 100B, 100C, and 100D in accordance with some embodiments. Each of device regions 100A, 100B, 100C, and 100D may be an n-type FinFET or a p-type FinFET in any combination. In an example embodiment as discussed below, an n-type FinFET is formed in device region 100A, and the FinFETs formed in device regions 100B, 100C, and 100D are p-type FinFETs.

Figure 10:
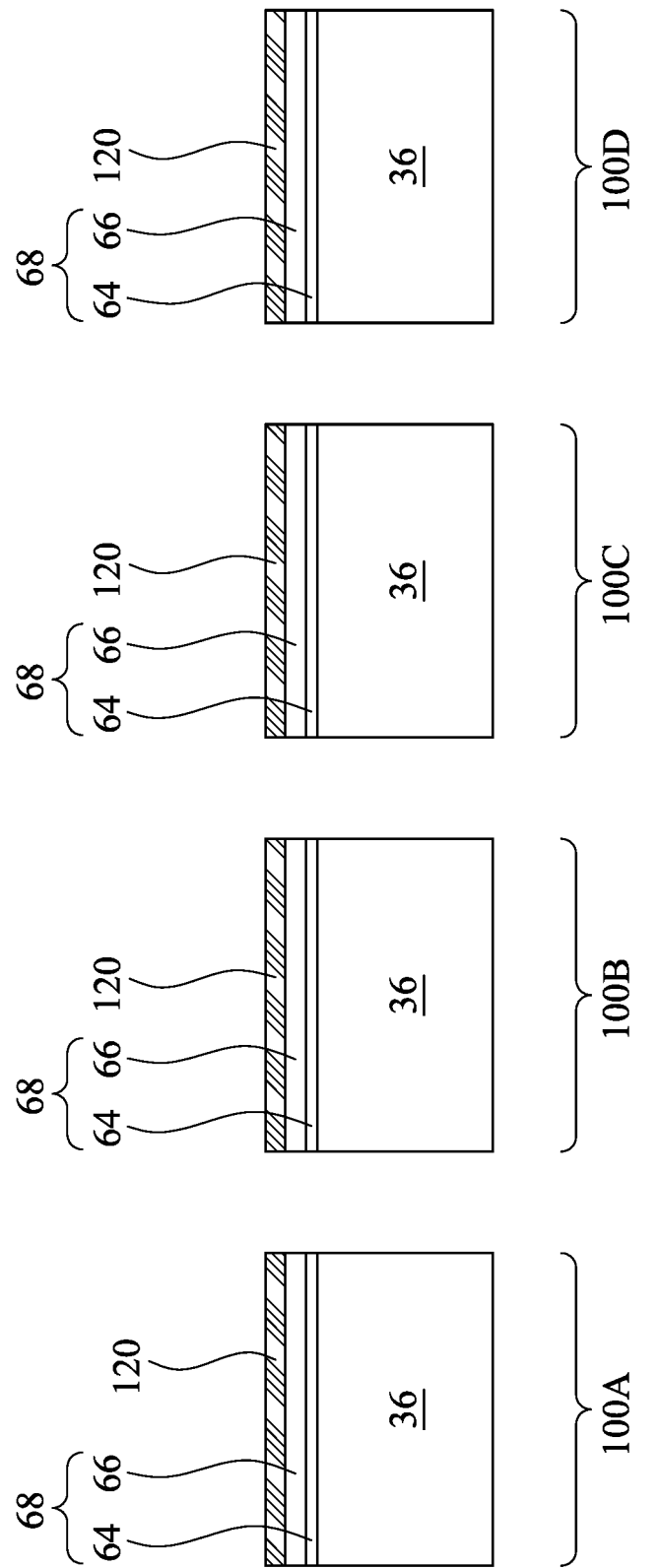
FIGS. 10 through 21 illustrate the perspective views and cross-sectional views of intermediate stages in the formation of gate stacks of a plurality of transistors in accordance with some embodiments.

Referring to FIG. 10, gate dielectric 68, which includes IL 64 and high-k dielectric layer 66, is formed simultaneously in device regions 100A, 100B, 100C, and 100D. The respective process is illustrated as process 302 in the process flow 300 as shown in FIG. 25. IL 64 is formed on protruding fin 36. High-k dielectric layer 66 is formed over IL 64.

In subsequent processes, work function layers may be formed directly on high-k dielectric layer 66, and may be patterned to reveal high-k dielectric layer 66. To reduce the loss of high-k dielectric layer 66 in the patterning of the work function layers, the high-k dielectric layer 66 may be strengthened through a thermal annealing process. In accordance with some embodiments, the thermal annealing process is performed at a temperature in a range between about 700° C. and about 900° C., with an annealing spike having a duration shorter than about 1 second. The process gas for the thermal annealing process may include $N_2$, $NH_3$, and/or the like. In the anneal process, high-k dielectric layer 66 is exposed to the process gases.

Further referring to FIG. 10, a first work function layer 120 is deposited on high-k dielectric layer 66, and extends into device regions 100A, 100B, 100C, and 100D. The respective process is illustrated as process 304 in the process flow 300 as shown in FIG. 25. In accordance with some embodiments, work function layer 120 has a first p-type work function, which is greater than a mid-band work function of protruding fins 36. The mid-band work function is in the middle of the valance band and the conduction band of protruding fins 36. The material of work function layer 120 may be selected from a compound material such as TiN, TaN, $Ti_xAl_yN$, $Ti_xSi_yN$, $WC_xN_y$, $MoC_xN_y$, or the like, or combinations thereof. Integers x and y indicate the atomic numbers. The material of work function layer 120 may also be selected from an elemental material such as Au, Pt, Pd, W, or the like, or alloys thereof. The material of work function layer 120 may also include the compound material doped with the elemental material as aforementioned. The first work function layer 120 may be deposited using ALD, CVD, or the like, and is deposited as a conformal layer, which extends into trenches 62 (FIG. 8) and also has portions on top of ILD 60.

Figure 11:
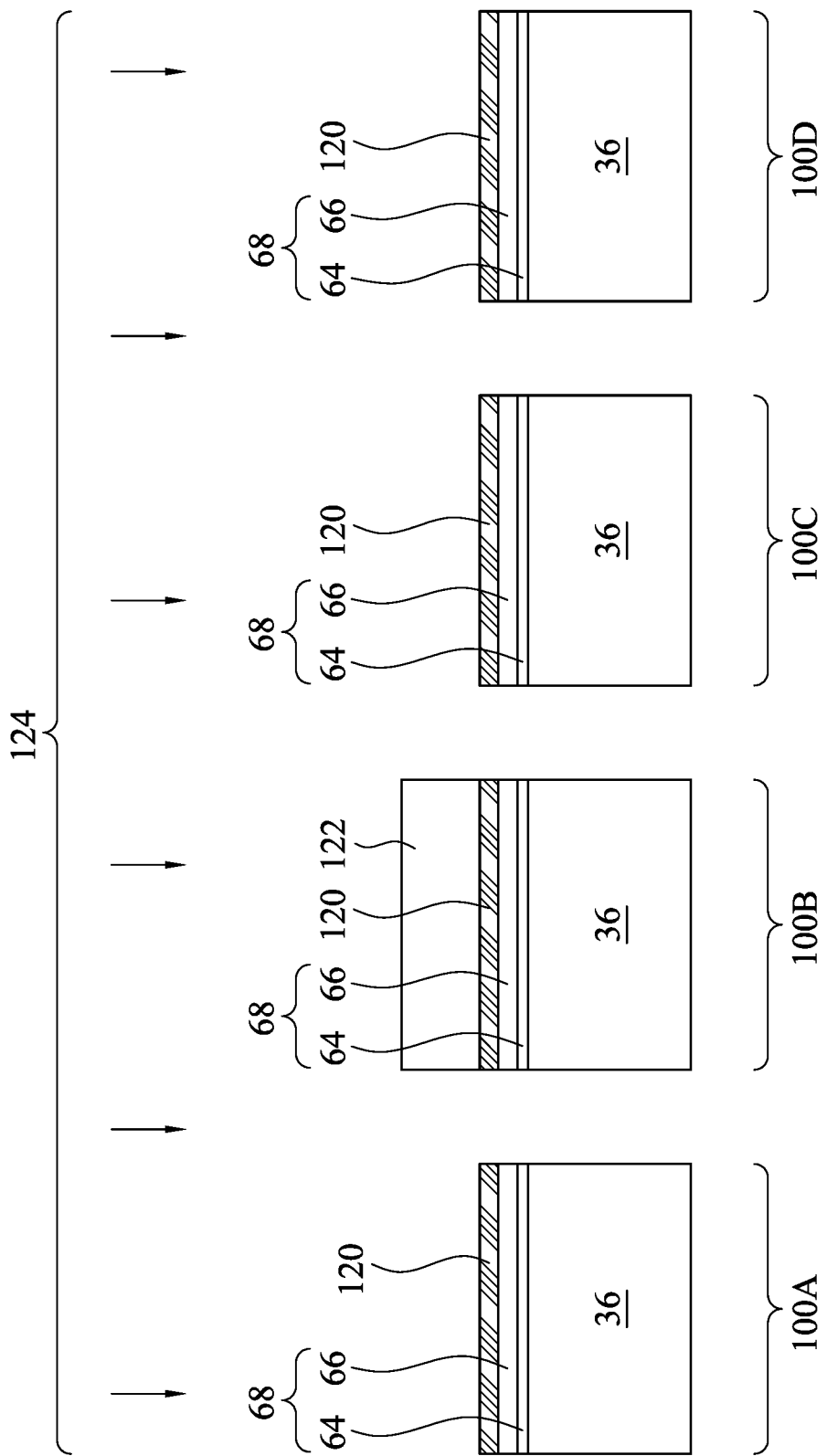
Figure 12:
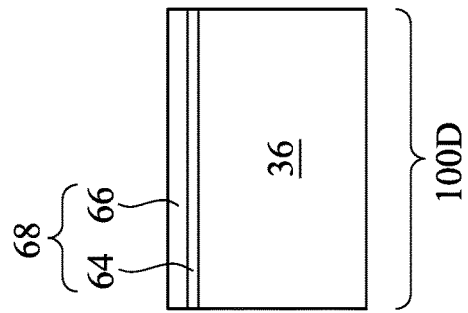
Figure 12:
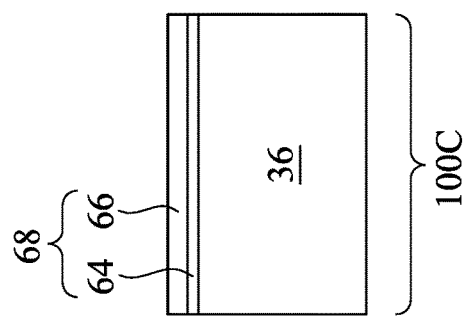
Figure 12:
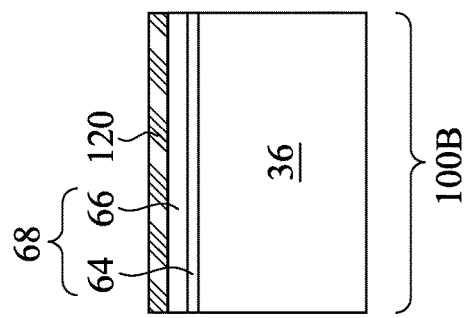
Figure 12:
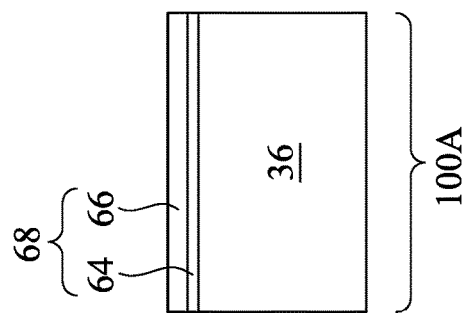

Referring to FIG. 11, etching mask 122 is formed and patterned. Etching mask 122 may include a photo resist, and may also include a metal hard mask, an anti-reflection coating, or the like. The respective process is illustrated as process 306 in the process flow 300 as shown in FIG. 25. The portions of etching mask 122 in device regions 100A, 100C, and 100D are removed, with a remaining portion left in device region 100B. Etching process 124 is then performed to remove the portions of work function layer 120 in device regions 100A, 100C, and 100D, exposing the respective portions of high-k dielectric layer 66. The respective process is illustrated as process 308 in the process flow 300 as shown in FIG. 25. The portion of work function layer 120 in device region 100B remains after the etching. During etching process 124, high-k dielectric layer 66 is used as an etch stop layer. If the etching rate of work function layer 120 is represented as ER120, and the etching rate of high-k dielectric layer 66 is represented as ER66, etching selectivity ER120/ER66 may be greater than about 100, and may be in the range between about 100 and about 150. In accordance with some embodiments, work function layer 120 comprises TiN, while high-k dielectric layer 66 comprises $HfO_2$ and $H_2O_2$ may be used as an etching gas. Etching mask 122 is then removed, and the resulting structure is shown in FIG. 12.

To reduce the damage to high-k dielectric layer 66, in etching process 124, soft wet etching technique may be adopted. In accordance with some embodiments, the soft wet etching is performed using an etchant with a high etching selectivity higher than about 100. In the subsequent processes, whenever a work function layer is patterned, to reduce the damage to the underlying work function layer and/or high-k dielectric layer 66, the soft wet etching technique may be adopted.

Figure 13:
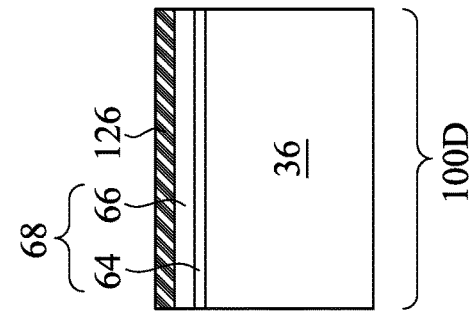
Figure 13:
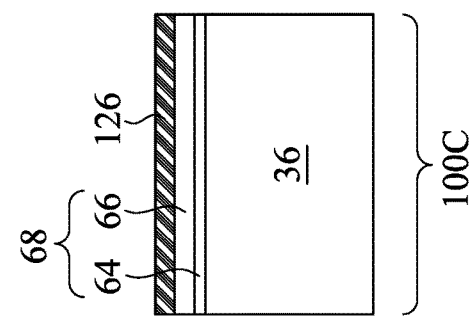
Figure 13:
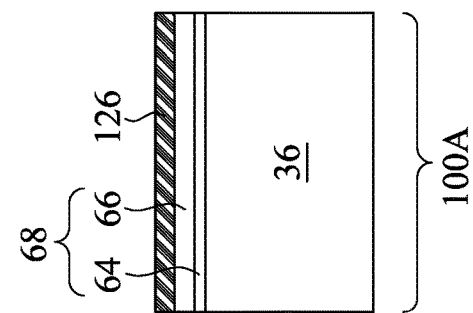

Referring to FIG. 13, a second work function layer 126 is deposited. The respective process is illustrated as process 310 in the process flow 300 as shown in FIG. 25. In accordance with some embodiments, the FinFETs in device regions 100B, 100C, and 100D are p-type FinFETs, and hence work function layer 126 has a second p-type work function. In accordance with some embodiments, the second work function is different from, and may be greater than or smaller than the first work function of work function layer 120. The difference between the first and the second work functions may be greater than about 50 mV, and may be in the range between about 50 mV and about 150 mV, while greater or smaller differences may be adopted also. The material of work function layer 126 may be selected from the same (or different) group of candidate materials for forming work function layer 120, while the materials of work function layers 120 and 126 are different from each other. The second work function layer 126 may be deposited using ALD, CVD, or the like, and is deposited as a conformal layer, which extends into trenches 62 (FIG. 8) and also has portions on top of ILD 60.

Figure 14:
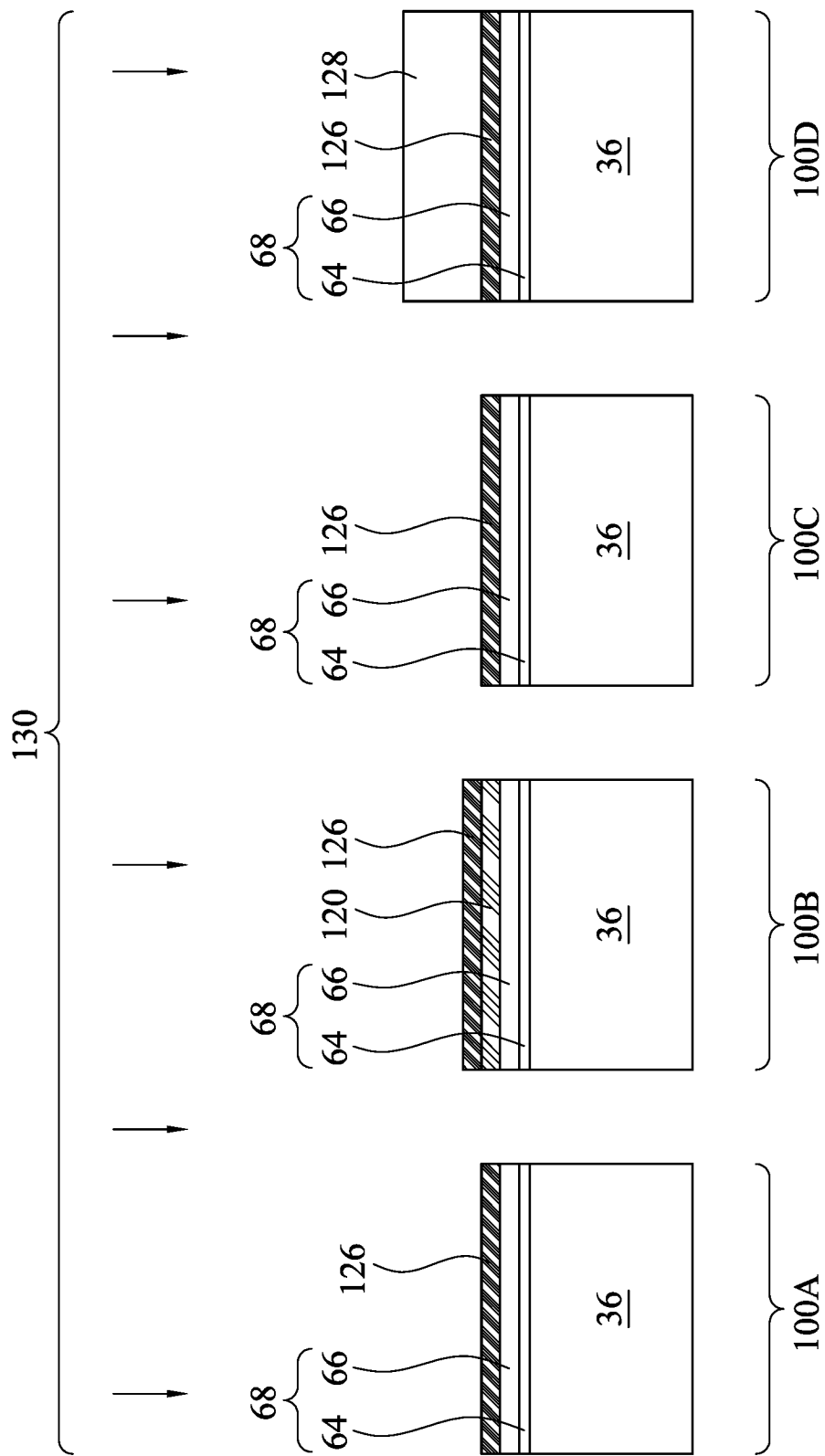
Figure 15:
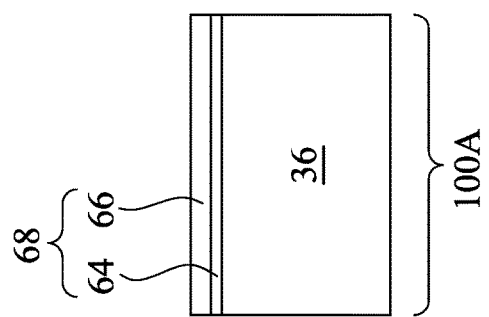
Figure 15:
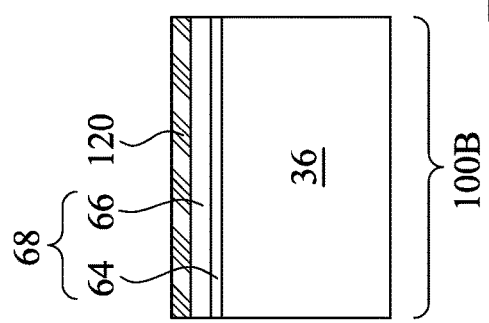
Figure 15:
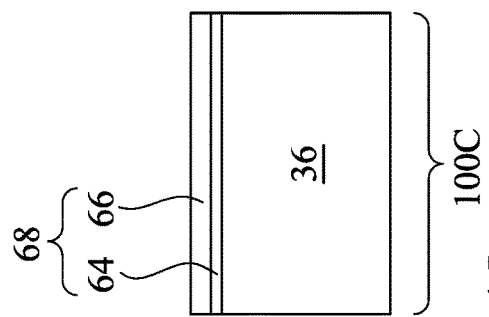
Figure 15:
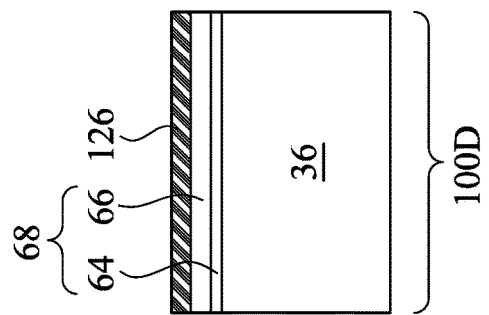

Referring to FIG. 14, etching mask 128 is formed and patterned. The respective process is illustrated as process 312 in the process flow 300 as shown in FIG. 25. The portions of etching mask 128 in device regions 100A, 100B, and 100C are removed, with a portion remaining in device region 100D. Etching process 130 is then performed to remove the portions of work function layer 126 in device regions 100A, 100B, and 100C, exposing the underlying high-k dielectric layer 66 or work function layer 120, as shown in FIG. 15. The respective process is illustrated as process 314 in the process flow 300 as shown in FIG. 25. The portion of work function layer 132 in device region 100D remains after the etching. In the etching process 130, in device regions 100A and 100C, high-k dielectric layer 66 is used as an etch stop layer. In device region 100B, work function layer 120 is used as the etch stop layer. Accordingly, the etching selectivity of work function layer 126 and work function layer 120 is high. For example, if the etching rates of work function layers 120 and 126 are represented as ER120 and ER126 respectively, the etching selectivity ER126/ER120 is greater than about 100, and may be in the range between about 100 and about 150. In accordance with some embodiments, work function layer 120 is formed of TaN, and work function layer 126 is formed of TiN. Accordingly, HCl solution may be used as an etching chemical to etch work function layer 126, and the etching is stopped on work function layer 120. Similarly, the etching selectivity ER126/ER66 is also high. For example, etching selectivity ER126/ER66 is greater than about 100, and may be in the range between about 100 and about 150. After the etching, etching mask 128 (FIG. 14) is removed, and the resulting structure is shown in FIG. 15.

Figure 16:
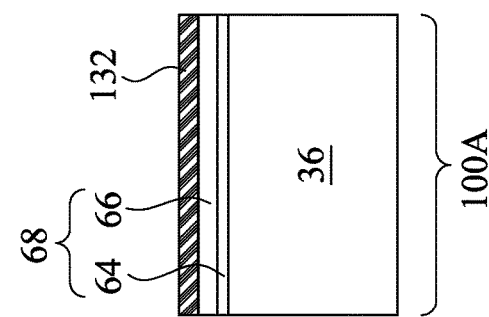
Figure 16:
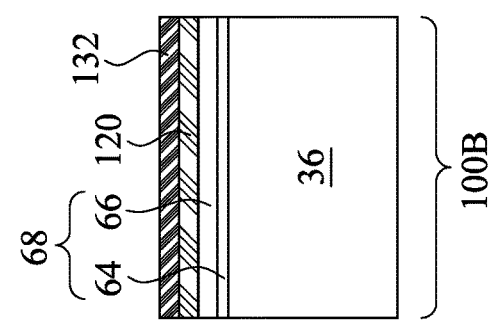
Figure 16:
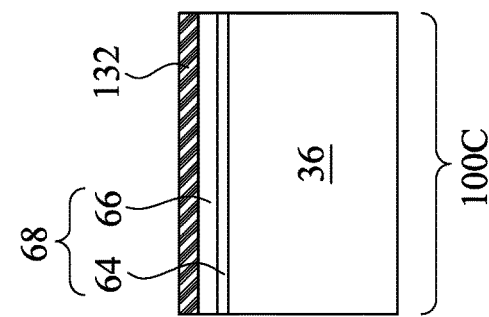
Figure 16:
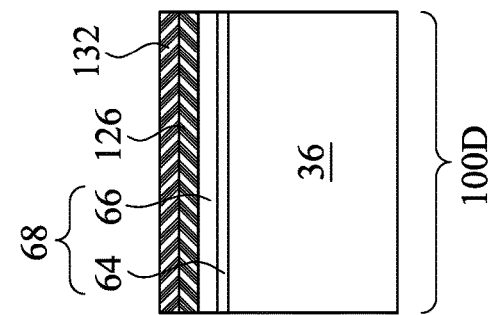

Referring to FIG. 16, a third work function layer 132 is deposited. The respective process is illustrated as process 316 in the process flow 300 as shown in FIG. 25. In accordance with some embodiments, work function layer 132 has a third p-type work function different from the first work function of work functions layer 120 and the second work function of work function layer 126. In accordance with some embodiments, the third work function is different from, and may be greater than or smaller than, either of the first work function and the second work function. The difference between the third work function and either of the first and the second work functions may be greater than about 50 mV, and may be in the range between about 50 mV and about 150 mV, while greater or smaller differences may be adopted. The material of work function layer 132 may be selected from the same or different group of candidate materials of work function layers 120 and 126. The materials of work function layers 120, 126, and 130 are different from each other. For example, work function layers 120, 126, and 132 may be formed of TiN, WCN, and TiSiN, respectively, which have work functions with a relatively large difference from each other. Work function layer 132 may be deposited using ALD, CVD, or the like, and is deposited as a conformal layer, which extends into trenches 62 (FIG. 8) and also has portions on top of ILD 60.

Figure 17:
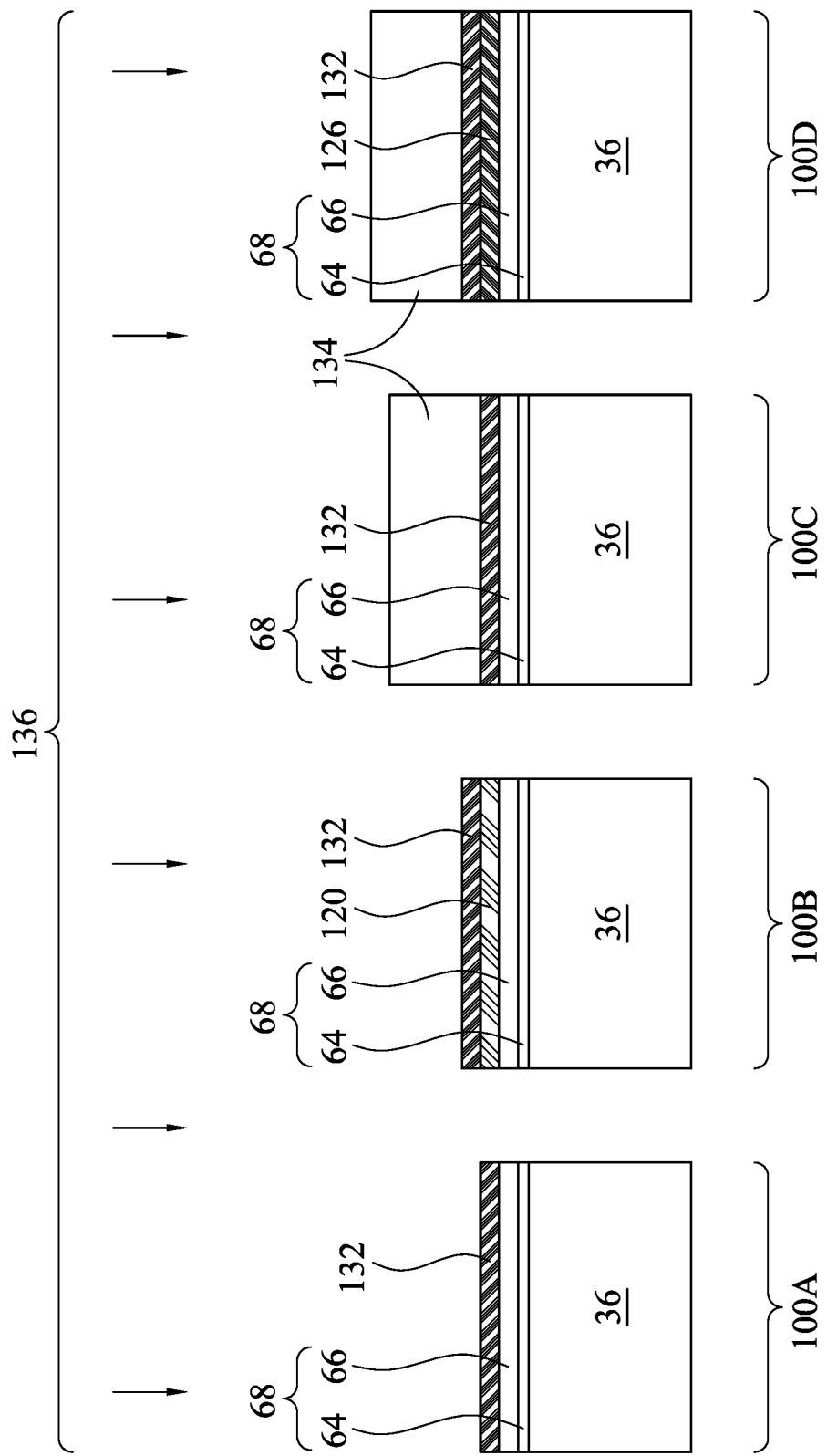
Figure 18:
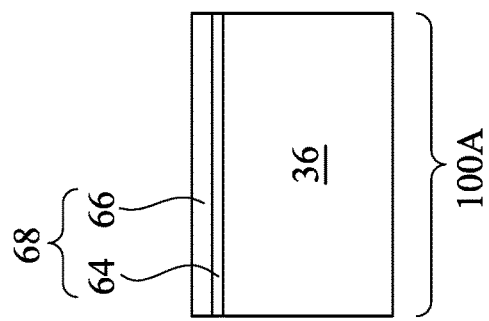
Figure 18:
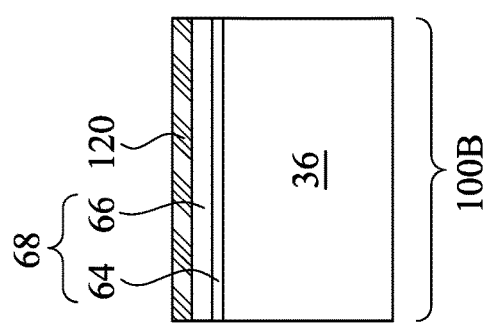
Figure 18:
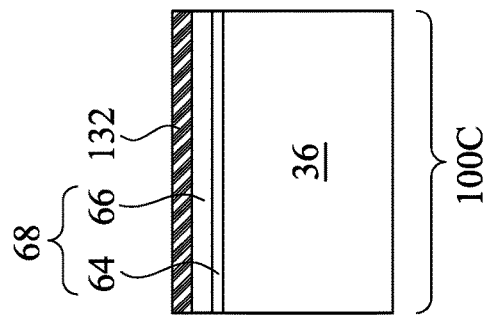
Figure 18:
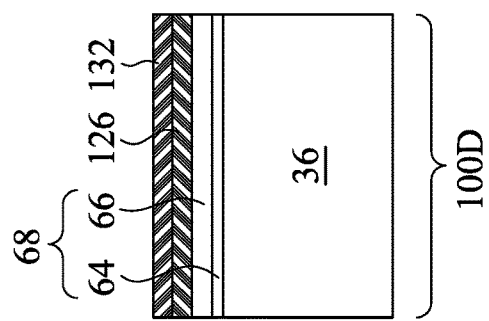

Referring to FIG. 17, etching mask 134 is formed and patterned. The respective process is illustrated as process 318 in the process flow 300 as shown in FIG. 25. The portions of etching mask 134 in device regions 100A and 100B are removed, with the portions in device regions 100C and 100D remaining. Etching process 136 is then performed to pattern and remove the portions of work function layer 132 in device regions 100A and 100B, exposing the underlying high-k dielectric layer 66 or work function layer 120. The respective process is illustrated as process 320 in the process flow 300 as shown in FIG. 25. The portions of work function layer 132 in device regions 100C and 100D remain after the etching. In the etching process, in device region 100A, high-k dielectric layer 66 is used as an etch stop layer. In device region 100B, work function layer 120 is used as an etch stop layer. Accordingly, the etching selectivity of work function layer 132 and work function layer 120 is high, for example, with etching selectivity ER132/ER120 being greater than about 20, and may be in the range between about 100 and about 150. Similarly, the etching selectivity ER132/ER66 is also high. For example, etching selectivity ER126/ER66 is greater than about 20, and may be in the range between about 100 and about 150. After the etching, etching mask 134 is removed, and the resulting structure is shown in FIG. 18.

Figure 19:
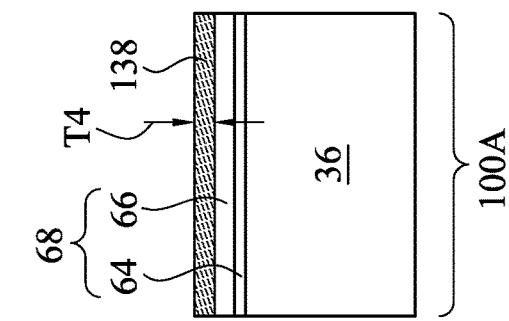
Figure 19:
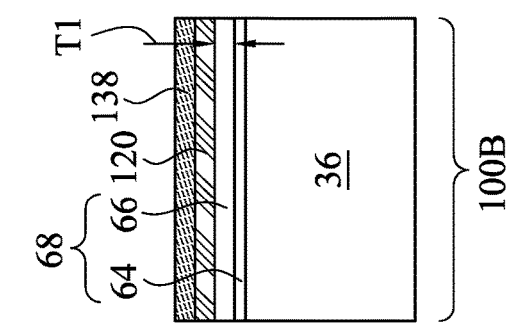
Figure 19:
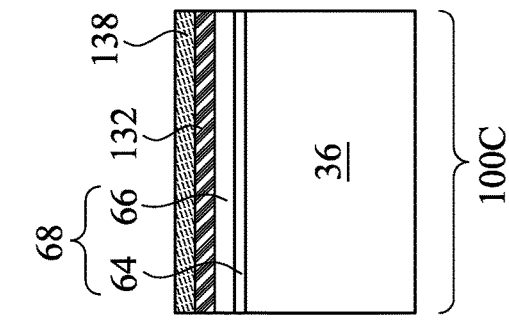
Figure 19:
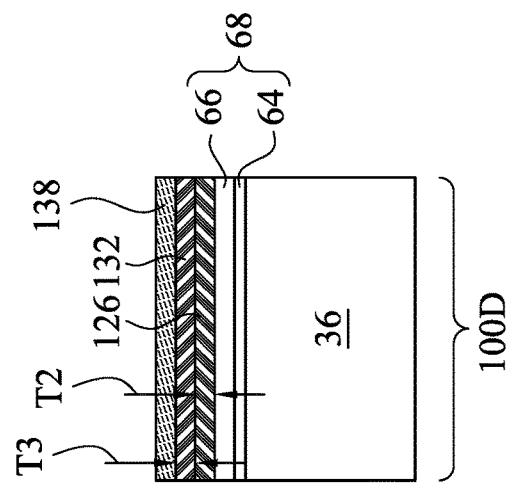

FIG. 19 illustrates the deposition of work function layer 138, which extends into device regions 100A, 100B, 100C, and 100D. The respective process is illustrated as process 322 in the process flow 300 as shown in FIG. 25. In accordance with some embodiments, the FinFET in device region 100A is an n-type FinFET, and hence work function layer 138 has an n-type work function, which is lower than the mid-band work function of protruding fins 36. The material of work function layer 138 may be selected from TiC, TaC, TiAlC, Ti, Al, or the like, or combinations thereof. Work function layer 138 may be deposited using ALD, CVD, or the like, and is deposited as a conformal layer, which extends into trenches 62 (FIG. 8) and also has portions on top of ILD 60.

In accordance with some embodiments, work function layers 120, 126, 132, and 138 have thicknesses T1, T2, T3, and T4, respectively. Each of thicknesses T1, T2, T3, and T4 may be in the range between about 10 Å and about 30 Å. The total thicknesses of the all work function layers in each of device regions 100A, 100B, 100C, and 100D may be smaller than about 50 Å, and may be in the range between about 30 Å and about 50 Å. In accordance with some embodiments, additional work function layer(s) (not shown) may be deposited and patterned to stack over the p-type work function layers 120, 126, and 132 in device regions 100B, 100C, and 100D, with the additional work function layers being between the top p-type work function layer and n-type work function layer 138. In accordance with alternative embodiments, no additional work function layers are formed.

Figure 20:
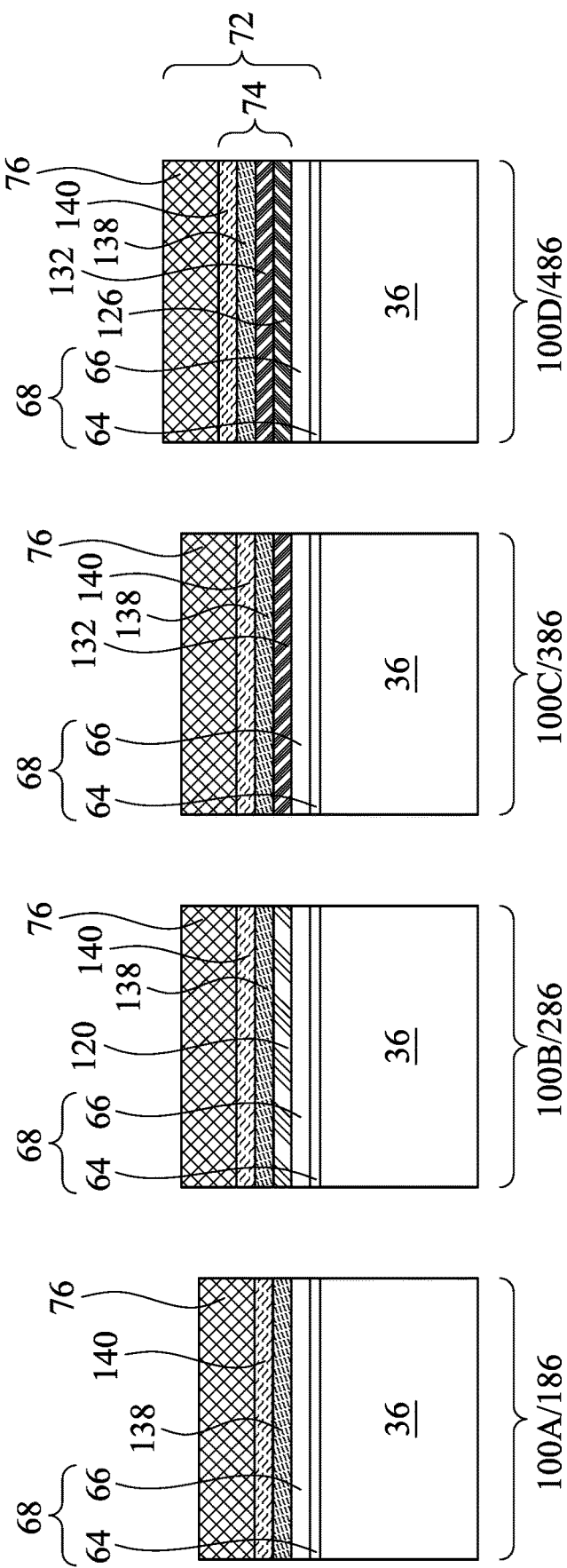

FIG. 20 illustrates the formation of glue layer 140. The respective process is illustrated as process 324 in the process flow 300 as shown in FIG. 25. Glue layer 140 may be formed of a metal nitride such as TiN in accordance with some embodiments, and other materials such as TaN may be used. In accordance with some embodiments, glue layer 140 is formed using ALD.

FIG. 20 further illustrates the deposition of a filling metal to form filling-metal region 76. The respective process is illustrated as process 326 in the process flow 300 as shown in FIG. 25. In accordance with some embodiments, filling-metal region 76 is formed of tungsten or cobalt, which may be formed using chemical vapor deposition. For example, $WF_6$ and $SiH_4$ may be used as process gases for depositing tungsten. After the formation of filling-metal region 76, a planarization process is performed to remove excess portions of the deposited layers as shown in FIG. 20, which excess portions are on top of ILD 60 (FIG. 8). The respective planarization process is illustrated as process 328 in the process flow 300 as shown in FIG. 25. The gate stacks 72 as shown in FIGS. 9A and 9B are thus formed.

Figure 22:
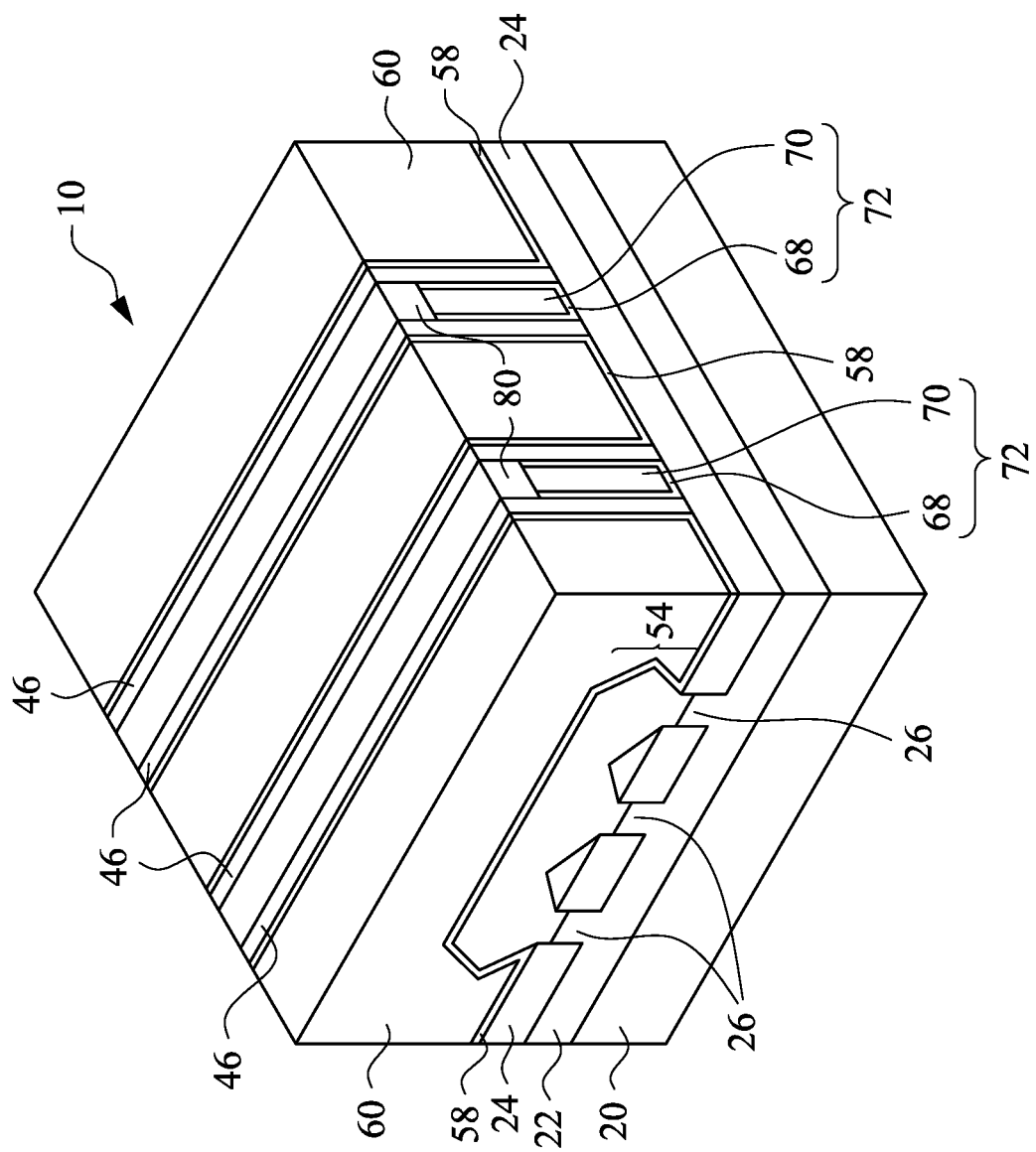

FIG. 22 illustrates the formation of hard masks 80 in accordance with some embodiments. The respective process is illustrated as process 220 in the process flow 200 shown in FIG. 24. The formation of hard masks 80 may include performing an etching process to recess gate stacks 72, so that recesses are formed between gate spacers 46, filling the recesses with a dielectric material, and then performing a planarization process such as a CMP process or a mechanical grinding process to remove excess portions of the dielectric material. Hard masks 80 may be formed of silicon nitride, silicon oxynitride, silicon oxy-carbo-nitride, or the like.

Figure 23:
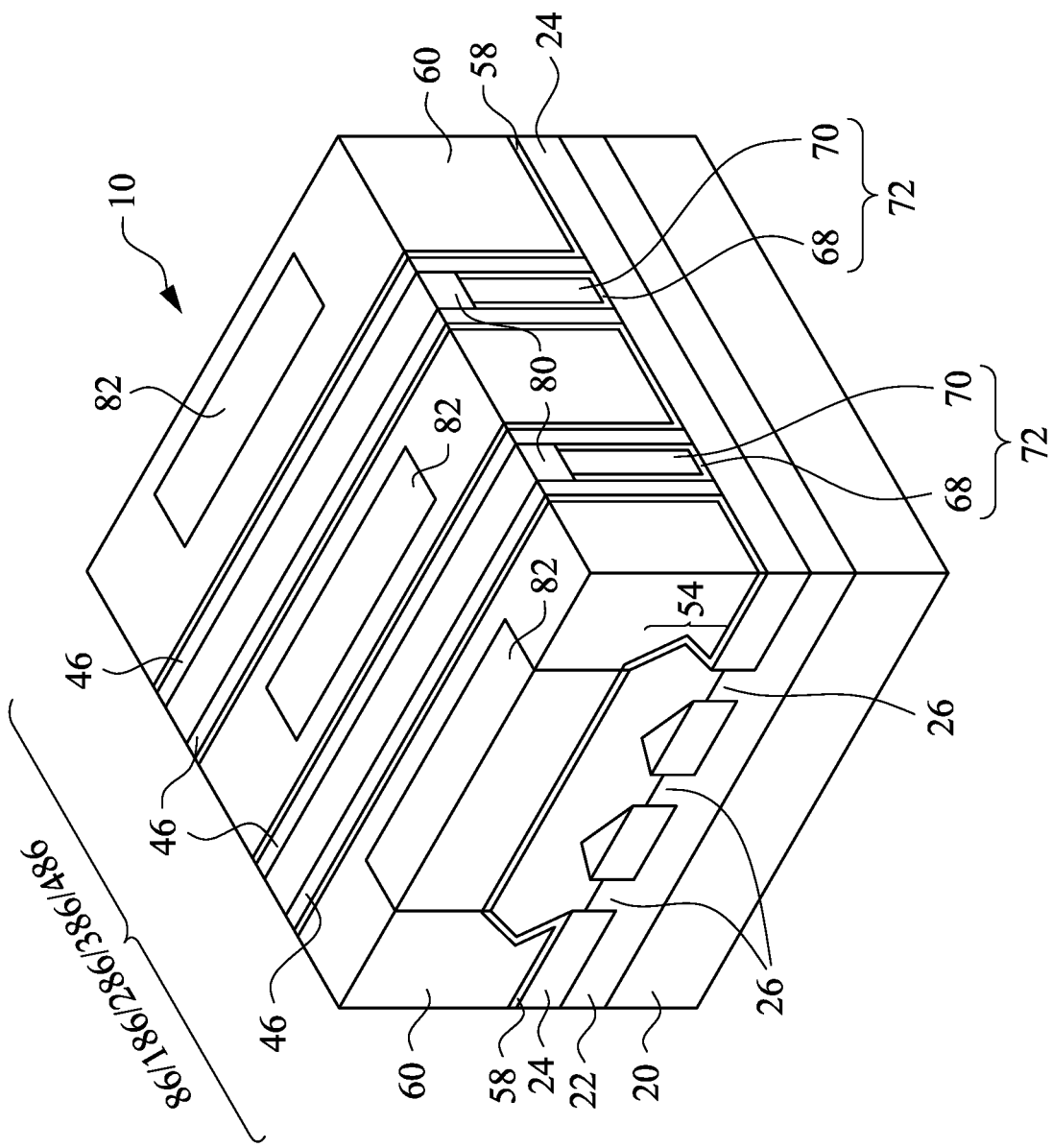

FIG. 23 illustrates the formation of source/drain contact plugs 82. The respective process is illustrated as process 222 in the process flow 200 shown in FIG. 24. The formation of source/drain contact plugs 82 includes etching ILD 60 to expose the underlying portions of CESL 58, and then etching the exposed portions of CESL 58 to reveal source/drain regions 54. In a subsequent process, a metal layer (such as a titanium layer) is deposited and extending into the contact openings. A metal nitride capping layer may be formed. An anneal process is then performed to react the metal layer with the top portion of source/drain regions 54 to form silicide regions 84. A filling-metallic material such as tungsten, cobalt, or the like, is then filled into the contact openings, followed by a planarization to remove excess materials, resulting in source/drain contact plugs 82. Gate contact plugs (not shown) are also formed to penetrate through a portion of each of hard masks 80 to contact gate electrodes 70. FinFETs 86, which may be connected in parallel as one FinFET, is thus formed.

The above-discussed processes results in four FinFETs 186, 286, 386, and 486, which include the gate stacks as shown in device regions 100A, 100B, 100C, and 100D in FIG. 20. Each of FinFETs 186, 286, 386, and 486 is also represented as the FinFET 86 in FIG. 23. FinFET 186 is in device region 100A, and may be an n-type FinFET, whose work function is determined by work function layer 138. FinFET 286 is in device region 100B, and may be a p-type FinFET, whose work function is dominated by work function layer 120, with work function layer 138 having smaller effect to the work function of FinFET 286. FinFET 386 is in device region 100C, and may be a p-type FinFET, whose work function is dominated by work function layer 132, with work function layer 138 having smaller effect to the work function of FinFET 386. FinFET 486 is in device region 100D, and may be a p-type FinFET, whose work function is dominated by work function layer 126, with work function layers 132 and 138 having smaller effect to the work function of FinFET 386. Accordingly, by selecting appropriate work function materials that are different from each other, some work function layers may be removed from some device regions, and the total thicknesses of the work function layers is small. For example, in the illustrated example, there are at most three work function layers (in device region 100D), while there are at least four work functions, and four threshold voltage levels.

Figure 21:
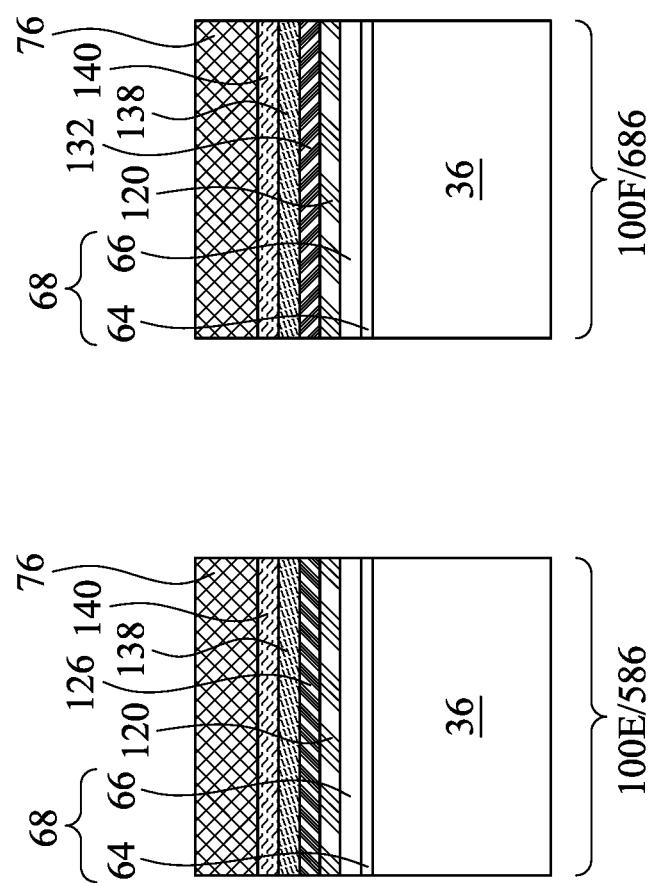

Furthermore, using the same processes as discussed above, additional FinFETs with different work functions than the gate stacks shown in FIG. 20 may be formed in additional device regions, which are shown as device regions 100E and 100F in FIG. 21. A first additional FinFET 586 may be formed in device region 100E, whose work function layers include layer 120 and layer 126 over layer 120. A second additional FinFET 686 may be formed in device region 100F, whose work function layers include layer 120 and layer 132 over layer 120. Accordingly, the additional FinFETs may have work functions (and the corresponding threshold voltages) different from that of the FinFETs 186, 286, 386, and 486. The formation of the additional FinFETs may be achieved by sharing the same processes as FinFETs 186, 286, 386, and 486, except the patterns of etching masks are modified to form the gate stacks in device regions 100E and 100F.

In above-discussed examples, p-type work function layers are formed for different p-type FinFETs and to result in different threshold voltages. An n-type work function layer is then deposited for an n-type FinFET and over the work function layers of the p-type FinFETs. In accordance with alternative embodiments, a plurality of n-type work function layers may be formed and patterned for different n-type FinFETs and to result in different threshold voltages. A p-type work function layer may then be deposited for a p-type FinFET, with the p-type work function layer being over the work function layers of the n-type FinFETs.

The embodiments of the present disclosure are distinguishable structurally. For example, Transmission Electron Microscopy (TEM) may be used to distinguish the boundaries of different work function layers and their overlying and underlying layers. X-ray photoelectron spectroscopy (XPS) may be used to determine compositions of the layers. Energy-dispersive X-ray spectroscopy (EDX) may be used to determine the elements in the work function layers.

The embodiments of the present disclosure have some advantageous features. By adopting work function layers having different work functions, some work function layers may be removed from some transistor regions to reduce the total thickness of the work function layers. This overcomes the problems in conventional processes. For example, in conventional processes, in order to achieve more work function levels (and threshold voltage levels), more work function layers are stacked. For example, a single TiN layer, two TiN layers, and three TiN layers may be used to achieve three work function levels and corresponding three threshold voltage levels. Stacking more layers to achieved lower work function levels, however, results in the increase in the total thickness of the work function layers, and this becomes infeasible in more advanced technologies. Furthermore, the capping layer(s) and barrier layer(s), which were conventionally formed between high-k dielectric layer and work function layer(s), are skipped in the embodiments of the present disclosure in order to reduce the thickness of gate stacks.

In accordance with some embodiments of the present disclosure, a method comprises forming a gate dielectric extending over a first semiconductor region and a second semiconductor region in a first device region and a second device region, respectively; depositing a first work function layer extending into the first semiconductor region and the second semiconductor region and over the gate dielectric; removing the first work function layer from the second device region, wherein the first work function layer is left in the first device region to form a first part of a first gate stack of a first transistor; depositing a second work function layer, wherein the second work function layer extends into the first device region and is over the first work function layer, and extends into the second device region and is over the gate dielectric; removing the second work function layer from the first device region, wherein the second work function layer is left in the second device region to form a second part of a second gate stack of a second transistor; and depositing a glue layer, wherein the glue layer extends into the first device region and is over the first work function layer, and extends into the second device region and is over the second work function layer.

In an embodiment, the depositing the first work function layer and the depositing the second work function layer comprise depositing different materials. In an embodiment, the first work function layer and the second work function layer have a difference in work functions, and the difference is greater than about 50 mV. In an embodiment, the first work function layer is formed of TiN, and the second work function layer is formed of WCN or TiSiN. In an embodiment, in the removing the first work function layer from the second device region, the gate dielectric is used as an etch stop layer. In an embodiment, in the removing the second work function layer from the first device region, the first work function layer is used as an etch stop layer.

In an embodiment, both of the first work function layer and the second work function layer are of a first conductivity type, and the method further comprises depositing a third work function layer extending into the first device region and over the first work function layer, and extending into the second device region and over the second work function layer, wherein the third work function layer is underlying the glue layer, and the third work function layer is of a second conductivity opposite to the first conductivity type. In an embodiment, the glue layer is over and physically contacting portions of the third work function layer in both of the first device region and the second device region.

In an embodiment, both of the first work function layer and the second work function layer extend into a third device region, and wherein after the first work function layer is removed from the second device region and after the second work function layer is removed from the second device region, both of the first work function layer and the second work function layer remain in the third device region and form a third part of a third gate stack of a third transistor. In an embodiment, the first work function layer extends into the first device region to physically contact a first portion of a high-k dielectric layer of the gate dielectric, and the second work function layer extends into the second device region to physically contact a second portion of the high-k dielectric layer.

In accordance with some embodiments of the present disclosure, a structure comprises a semiconductor substrate comprising a first semiconductor region and a second semiconductor region; a first transistor comprising a first gate dielectric over the first semiconductor region; a first work function layer over and contacting the first gate dielectric; and a first conductive region over the first work function layer; and a second transistor comprising a second gate dielectric over the second semiconductor region; a second work function layer over and contacting the second gate dielectric, wherein the first work function layer and the second work function layer have different work functions; and a second conductive region over the second work function layer.

In an embodiment, a difference between work functions of the first work function layer and the second work function layer is greater than about 50 mV. In an embodiment, the first work function layer is formed of TiN, and the second work function layer is formed of WCN or TiSiN. In an embodiment, both of the first work function layer and the second work function layer are of a first conductivity type, and the structure further comprises a third work function layer over and contacting the first work function layer; and a fourth work function layer over and contacting the second work function layer, wherein the third work function layer and the fourth work function layer are formed of a same material, and of a second conductivity type opposite to the first conductivity type.

In an embodiment, the first transistor further comprises a first glue layer over and physically contacting the third work function layer, and the second transistor further comprises a second glue layer over and physically contacting the second work function layer, with the first glue layer and the second glue layer being formed of a same additional material. In an embodiment, the first glue layer and the second glue layer are formed of titanium nitride.

In accordance with some embodiments of the present disclosure, a structure comprises a bulk semiconductor substrate; a first FinFET comprising a first semiconductor fin protruding higher than the bulk semiconductor substrate; a first high-k dielectric layer on first sidewalls and a first top surface of the first semiconductor fin; a first work function layer over and contacting the first high-k dielectric layer; a second work function layer over and contacting the first work function layer; and a first glue layer over and contacting the second work function layer; and a second FinFET comprising a second semiconductor fin protruding higher than the bulk semiconductor substrate; a second high-k dielectric layer on second sidewalls and a second top surface of the second semiconductor fin; a third work function layer over and contacting the second high-k dielectric layer, wherein the first work function layer and the third work function layer have different work functions, and are both of a first conductivity type; a fourth work function layer over and contacting the third work function layer, wherein the second work function layer and the fourth work function layer are formed of a same material, with the same material being of a second conductivity type opposite to the first conductivity type; and a second glue layer over and contacting the fourth work function layer.

In an embodiment, both of the first work function layer and the third work function layer are p-type work function layers. In an embodiment, the first work function layer and the third work function layer comprise different elements. In an embodiment, the structure further comprises a third FinFET comprising a third semiconductor fin protruding higher than the bulk semiconductor substrate; a third high-k dielectric layer on third sidewalls and a third top surface of the third semiconductor fin; a fifth work function layer over and contacting the third high-k dielectric layer, wherein the third work function layer and the fifth work function layer are formed of the same material of the second conductivity type; and a third glue layer over and contacting the fifth work function layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a semiconductor substrate;
   a first transistor comprising:
      a first work function layer of a first conductivity type overlying the semiconductor substrate; and
      a second work function layer over and physically contacting the first work function layer, wherein the second work function layer is of a second conductivity type opposite to the first conductivity type; and
   a second transistor comprising:
      a third work function layer of the first conductivity type overlying the semiconductor substrate, wherein the first work function layer and the third work function layer comprise different materials; and
      a fourth work function layer over and physically contacting the third work function layer, wherein the second work function layer and the fourth work function layer are formed of a same material.

2. The structure of claim 1 further comprising:
   a first high-k dielectric layer underlying and contacting the first work function layer; and
   a second high-k dielectric layer underlying and contacting the third work function layer.

3. The structure of claim 2, wherein the first high-k dielectric layer and the second high-k dielectric layer comprise a same high-k dielectric material.

4. The structure of claim 1 further comprising:
   a first glue layer and a second glue layer over and contacting the second work function layer and the fourth work function layer, respectively, wherein the first glue layer and the second glue layer are formed of a same material.

5. The structure of claim 4, wherein the first glue layer and the second glue layer comprise titanium nitride.

6. The structure of claim 1 further comprising:
   a first glue layer comprising titanium nitride over and contacting the second work function layer; and
   a second glue layer comprising titanium nitride over and contacting the fourth work function layer.

7. The structure of claim 1, wherein the first work function layer and the third work function layer have a difference in work functions, and the difference is greater than about 50 mV.

8. The structure of claim 1 further comprising a third transistor comprising:
   a fifth work function layer formed of a same material as the first work function layer over the semiconductor substrate;

a sixth work function layer over the fifth work function layer, wherein the sixth work function layer is formed of a same material as the third work function layer; and
a seventh work function layer over the sixth work function layer, wherein the sixth work function layer is formed of a same material as the second work function layer.

9. The structure of claim 1, wherein the first transistor and the second transistor are Fin-Field Effect (FinFET) transistors.

10. The structure of claim 1, wherein the first transistor and the second transistor are p-type transistors.

11. A structure comprising:
a semiconductor substrate comprising a first semiconductor region and a second semiconductor region;
a first transistor comprising:
  a first gate dielectric over the first semiconductor region;
  a first work function layer over the first gate dielectric;
  a second work function layer over and physically contacting the first work function layer; and
  a first conductive region over the second work function layer; and
a second transistor comprising:
  a second gate dielectric over the second semiconductor region;
  a third work function layer over the second gate dielectric, wherein the first work function layer and the third work function layer are of a same conductivity type, and have different work functions; and
  a fourth work function layer over and physically contacting the third work function layer, wherein the second work function layer and the fourth work function layer have a same work function; and
  a second conductive region over the fourth work function layer.

12. The structure of claim 11, wherein a difference between work functions of the first work function layer and the third work function layer is greater than about 50 mV.

13. The structure of claim 11, wherein the first work function layer is formed of TiN, and the third work function layer is formed of TiSiN.

14. The structure of claim 11, wherein both of the first work function layer and the third work function layer are p-type work function layers.

15. The structure of claim 14, wherein the second work function layer and the fourth work function layer are n-type work function layers.

16. The structure of claim 11, wherein the first conductive region further comprises a first glue layer over and physically contacting the third work function layer, and the second conductive region further comprises a second glue layer over and physically contacting the fourth work function layer, with the first glue layer and the second glue layer being formed of a same additional material.

17. The structure of claim 11, wherein the first transistor and the second transistor are p-type transistors.

18. A structure comprising:
a bulk semiconductor substrate;
a first p-type Fin Field-Effect Transistor (FinFET) comprising:
  a first semiconductor fin protruding higher than the bulk semiconductor substrate;
  a first high-k dielectric layer on first sidewalls and a first top surface of the first semiconductor fin;
  a first work function layer over and physically contacting the first high-k dielectric layer;
  a second work function layer over and physically contacting the first work function layer; and
  a first glue layer over the second work function layer; and
a second p-type FinFET comprising:
  a second semiconductor fin protruding higher than the bulk semiconductor substrate;
  a second high-k dielectric layer on second sidewalls and a second top surface of the second semiconductor fin;
  a third work function layer over and physically contacting the second high-k dielectric layer, wherein the first work function layer and the third work function layer are p-type work function layers, and the first work function layer and the third work function layer are formed of different materials;
  a fourth work function layer over and physically contacting the third work function layer, wherein the second work function layer and the fourth work function layer are n-type work function layers; and
  a second glue layer over the fourth work function layer.

19. The structure of claim 18, wherein the second work function layer and the fourth work function layer are formed of a same material and have a same work function.

20. The structure of claim 18, further comprising:
a fifth work function layer between the first work function layer and the second work function layer; and
a sixth work function layer under the third work function layer, wherein the sixth work function layer is formed of a same material as the first work function layer.

* * * * *